United States Patent
Hovis et al.

(10) Patent No.: US 10,310,572 B2
(45) Date of Patent: Jun. 4, 2019

(54) VOLTAGE BASED THERMAL CONTROL OF PROCESSING DEVICE

(71) Applicant: Microsoft Technology Licensing, LLC, Redmond, WA (US)

(72) Inventors: William Paul Hovis, Sammamish, WA (US); Garrett Douglas Blankenburg, Sammamish, WA (US); Peter Anthony Atkinson, Sammamish, WA (US); Robert James Ray, Snoqualmie, WA (US); Andres Felipe Hernandez Mojica, Seattle, WA (US); Samy Boshra-Riad, Bellevue, WA (US); Erng-Sing Wee, Bellevue, WA (US); Brian Keith Langendorf, Benicia, CA (US)

(73) Assignee: Microsoft Technology Licensing, LLC, Redmond, WA (US)

(*) Notice: Subject to any disclaimer, the term of this patent is extended or adjusted under 35 U.S.C. 154(b) by 42 days.

(21) Appl. No.: 15/178,912

(22) Filed: Jun. 10, 2016

(65) Prior Publication Data
US 2017/0357298 A1 Dec. 14, 2017

(51) Int. Cl.
*G06F 1/324* (2019.01)
*G06F 1/3296* (2019.01)
(Continued)

(52) U.S. Cl.
CPC .............. *G06F 1/206* (2013.01); *G06F 1/324* (2013.01); *G06F 1/3206* (2013.01);
(Continued)

(58) Field of Classification Search
CPC ........ G06F 1/206; G06F 1/3296; G06F 1/324; G06F 1/3206; G01R 31/3004
See application file for complete search history.

(56) References Cited

U.S. PATENT DOCUMENTS

| 5,752,011 A | 5/1998 | Thomas et al. |
| 6,229,751 B1 | 5/2001 | Kutaragi et al. |

(Continued)

FOREIGN PATENT DOCUMENTS

| EP | 2607987 A1 | 6/2013 |
| EP | 2889720 A1 | 7/2015 |
| WO | 2016087002 A1 | 6/2016 |

OTHER PUBLICATIONS

Ghosh, et al., "O2C: occasional two-cycle operations for dynamic thermal management in high performance in-order microprocessors", In Proceedings of ACM/IEEE International Symposium on Low Power Electronics and Design, Aug. 11, 2008, pp. 189-192.
(Continued)

*Primary Examiner* — Jaweed A Abbaszadeh
*Assistant Examiner* — Gayathri Sampath

(57) ABSTRACT

Thermal reduction and voltage adjustment techniques for computing systems and processing devices are presented herein. In a first example, a method of operating a voltage control system for a processing device includes operating the processing device in a computing assembly at a selected performance level, the processing device supplied with at least one input voltage at a first voltage level. The method includes monitoring thermal information associated with the computing assembly, and when the thermal information indicates a temperature associated with the computing assembly exceeds a threshold temperature, adjusting the at least one input voltage level supplied to the processing device to a second voltage level lower than the first voltage level and continuing to operate the processing device at the selected performance level.

18 Claims, 8 Drawing Sheets

(51) Int. Cl.
  *G06F 1/3206* (2019.01)
  *G06F 1/20* (2006.01)
  *G01R 31/30* (2006.01)

(52) U.S. Cl.
  CPC ........ *G06F 1/3296* (2013.01); *G01R 31/3004* (2013.01); *Y02D 10/126* (2018.01); *Y02D 10/16* (2018.01); *Y02D 10/172* (2018.01)

(56) References Cited

U.S. PATENT DOCUMENTS

| | | |
|---|---|---|
| 6,366,072 B2 | 4/2002 | Attimont et al. |
| 6,697,952 B1 | 2/2004 | King |
| 6,889,332 B2 | 5/2005 | Helms et al. |
| 7,002,265 B2 | 2/2006 | Potega |
| 7,100,061 B2 | 8/2006 | Halepete et al. |
| 7,254,721 B1 | 8/2007 | Tobias et al. |
| 7,320,079 B2 | 1/2008 | Suzuki et al. |
| 7,363,176 B2 | 4/2008 | Patel et al. |
| 7,430,675 B2 | 9/2008 | Lee |
| 7,487,012 B2 | 2/2009 | Bose et al. |
| 7,516,358 B2 | 4/2009 | Haefliger et al. |
| 7,521,960 B2 | 4/2009 | Balasubramanian et al. |
| 7,525,941 B2 | 4/2009 | Islam et al. |
| 7,539,880 B2 | 5/2009 | Mentzer et al. |
| 7,548,481 B1 | 6/2009 | Dewey et al. |
| 7,750,668 B2 | 7/2010 | Horiguchi et al. |
| 7,853,808 B2 | 12/2010 | Kim et al. |
| 8,078,887 B2 | 12/2011 | Matsui |
| 8,117,468 B2 | 2/2012 | Lin |
| 8,127,157 B2 | 2/2012 | Bilak |
| 8,294,440 B2 | 10/2012 | Lowe, Jr. |
| 8,327,158 B2 | 12/2012 | Titiano et al. |
| 8,635,470 B1 | 1/2014 | Kraipak et al. |
| 8,671,413 B2 | 3/2014 | Garash et al. |
| 9,015,500 B2 | 4/2015 | Guo et al. |
| 9,112,355 B2 | 8/2015 | Makino et al. |
| 9,122,291 B2 | 9/2015 | Moore et al. |
| 9,269,407 B1 | 2/2016 | Bickford et al. |
| 9,407,262 B2 | 8/2016 | von Kaenel |
| 10,082,861 B2 | 9/2018 | Fukuda et al. |
| 2005/0096863 A1 | 5/2005 | Pomaranski et al. |
| 2005/0188233 A1 | 8/2005 | Park |
| 2005/0210346 A1 | 9/2005 | Comaschi et al. |
| 2005/0218871 A1* | 10/2005 | Kang ............... G05F 1/40 323/265 |
| 2005/0283630 A1 | 12/2005 | Shikata |
| 2006/0069903 A1 | 3/2006 | Fischer et al. |
| 2006/0074576 A1 | 4/2006 | Patel et al. |
| 2006/0259840 A1 | 11/2006 | Abadeer et al. |
| 2007/0001697 A1 | 1/2007 | Dobberpuhl et al. |
| 2007/0061599 A1 | 3/2007 | Mentzer et al. |
| 2007/0139014 A1 | 6/2007 | Girson et al. |
| 2007/0174746 A1 | 7/2007 | Haefliger et al. |
| 2007/0273714 A1 | 11/2007 | Hodge et al. |
| 2008/0077348 A1 | 3/2008 | Hildebrand et al. |
| 2008/0100328 A1 | 5/2008 | Dhong et al. |
| 2008/0114568 A1* | 5/2008 | Marshall ............... G11C 5/147 702/182 |
| 2008/0168287 A1 | 7/2008 | Berry et al. |
| 2008/0178023 A1 | 7/2008 | Kim et al. |
| 2008/0186001 A1 | 8/2008 | Singh et al. |
| 2008/0215901 A1* | 9/2008 | Beard ................ G06F 1/206 713/300 |
| 2008/0307240 A1 | 12/2008 | Dahan et al. |
| 2009/0016140 A1 | 1/2009 | Qureshi et al. |
| 2009/0058842 A1 | 3/2009 | Bull et al. |
| 2009/0228727 A1 | 9/2009 | Tamura et al. |
| 2010/0063759 A1 | 3/2010 | Nishiyama |
| 2010/0095137 A1 | 4/2010 | Bieswanger et al. |
| 2010/0115475 A1 | 5/2010 | Buonpane et al. |
| 2010/0188115 A1 | 7/2010 | von Kaenel |
| 2010/0250981 A1 | 9/2010 | Pamley et al. |
| 2010/0289553 A1 | 11/2010 | Wang |
| 2011/0015884 A1 | 1/2011 | Chen |
| 2011/0109378 A1 | 5/2011 | Buechner et al. |
| 2011/0207509 A1 | 8/2011 | Crawford |
| 2012/0209448 A1 | 8/2012 | Brower |
| 2012/0210325 A1 | 8/2012 | de Lind van Wijngaarden et al. |
| 2013/0191678 A1 | 7/2013 | Busaba et al. |
| 2013/0311792 A1 | 11/2013 | Ponnathota et al. |
| 2014/0068285 A1 | 3/2014 | Lee et al. |
| 2014/0071844 A1 | 3/2014 | Mujtaba et al. |
| 2014/0176581 A1 | 6/2014 | Shrall et al. |
| 2014/0281696 A1 | 9/2014 | Bacha |
| 2014/0380071 A1 | 12/2014 | Lee et al. |
| 2015/0006915 A1 | 1/2015 | Ganesan et al. |
| 2015/0149796 A1 | 5/2015 | Muljono et al. |
| 2015/0192942 A1* | 7/2015 | Smith ............... G05F 1/465 327/540 |
| 2015/0253826 A1 | 9/2015 | de la Cropte de Chanterac et al. |
| 2015/0253836 A1 | 9/2015 | Mylius et al. |
| 2016/0048147 A1 | 2/2016 | Abhishek et al. |
| 2016/0062422 A1* | 3/2016 | Mittal ............... G06F 1/3234 713/320 |
| 2016/0066300 A1* | 3/2016 | McCabe ............ G06F 1/206 370/329 |
| 2017/0357279 A1 | 12/2017 | Hovis et al. |
| 2017/0357298 A1 | 12/2017 | Hovis et al. |
| 2017/0357310 A1 | 12/2017 | Hovis et al. |
| 2017/0357311 A1 | 12/2017 | Hovis et al. |

OTHER PUBLICATIONS

Lu, et al., "Improved Thermal Management with Reliability Banking", In Proceedings of IEEE Micro, vol. 25, Issue 6, Nov. 2005, pp. 40-49.

Sun, et al., "Three-Dimensional Multiprocessor System-on-Chip Thermal Optimization", In Proceedings of 5th IEEE/ACM/IFIP International Conference on Hardware/Software Codesign and System Synthesis, Sep. 30, 2007, pp. 117-122.

Hsu, et al., "The Design, Implementation, and Evaluation of a Compiler Algorithm for CPU Energy Reduction", In Proceedings of the ACM SIGPLAN conference on Programming language design and implementation, Jun. 9, 2003, 11 pages.

"i.MX 6Dual/6Quad Applications Processors for Industrial Products", Published on: Feb. 14, 2013 Available at: http://cache.freescale.com/files/32bit/doc/data_sheet/IMX6DQIEC.pdf.

"LM10500 5A Step-Down Energy Management Unit (EMU) With PowerWise™ Adaptive Voltage Scaling (AVS)", Published on: Sep. 2009 Available at: http://www.ti.com/lit/ds/symlink/lm10500.pdf.

Choi, et al., "Fine-Grained Dynamic Voltage and Frequency Scaling for Precise Energy and Performance Tradeoff Based on the Ratio of Off-Chip Access to On-Chip Computation Times", In Journal of IEEE Transactions on Computer-Aided Design of Integrated Circuits and Systems, vol. 24, No. 1, Jan. 2005, pp. 18-28.

Kim, et al., "System Level Analysis of Fast, Per-Core DVFS using On-Chip Switching Regulators", In Proceedings of IEEE 14th International Symposium on High Performance Computer Architecture, Feb. 16, 2008, pp. 123-134.

Yang, et al., "Energy-Aware Runtime Scheduling for Embedded Multiprocessor SOCs", In Journal of IEEE Design & Test of Computers, vol. 18, Issue 5, Sep. 2001, pp. 46-58.

Mansouri, et al., "Ring Oscillator Physical Unclonable Function with Multi Level Supply Voltages", In Proceedings of 30th International IEEE Conference on Computer Design, Sep. 30, 2012, 7 pages.

"International Search Report and Written Opinion Issued in PCT Application No. PCT/US2017/035565", dated: Aug. 28, 2017, 11 Pages.

"International Search Report and Written Opinion Issued in PCT Application No. PCT/US2017/035566", dated Aug. 11, 2017, 10 Pages.

"SMASH: Smarter Flash Memory Storage in Low-Power Devices", Retrieved on: Apr. 13, 2016 Available at: http://web.eecs.umich.edu/~kevinfu/IP/SMASH-UMass-Amherst-CVIP-summary.pdf.

"AM335x Power Management User Guide", Published on: Sep. 6, 2015 Available at: http://processors.wiki.ti.com/index.php/AM335x_Power_Management_User Guide.

(56) References Cited

OTHER PUBLICATIONS

"International Search Report and Written Opinion Issued in PCT Application No. PCT/US2017/035564", dated Aug. 22, 2017, 11 Pages.

"International Search Report and Written Opinion Issued in PCT Application No. PCT/US2017/035574", dated Sep. 1, 2017, 13 Pages.

Burd, et al., "A Dynamic Voltage Scaled Microprocessor System", In IEEE Journal of Solid-State Circuits, vol. 35, Issue 11, Nov. 9, 2000, pp. 1571-1580.

Pering, et al., "Voltage scheduling in the lpARM microprocessor system", In Proceedings of the International Symposium on Low Power Electronics and Design, Jul. 25, 2000, pp. 96-101.

"Final Office Action Issued in U.S. Appl. No. 15/178,873", dated Sep. 10, 2018, 21 Pages.

"Non Final Office Action Issued in U.S. Appl. No. 15/178,873", dated Feb. 7, 2018, 20 Pages.

"Non Final Office Action Issued in U.S. Appl. No. 15/178,966", dated Jun. 5, 2018, 10 Pages.

"Final Office Action Issued in U.S. Appl. No. 15/179,016", dated Jul. 3, 2018, 13 Pages.

"Non Final Office Action Issued in U.S. Appl. No. 15/179,016", dated Feb. 1, 2018, 13 Pages.

"Notice of Allowance Issued in U.S. Appl. No. 15/178,873", dated Feb. 13, 2019, 6 Pages.

\* cited by examiner

VOLTAGE BASED THERMAL CONTROL OF PROCESSING DEVICE

BACKGROUND

Integrated circuits, such as those employed in computing systems and associated processor devices, typically consume electrical power in relation to a supply voltage, operating frequency, performance level, or according to characteristics of various leakage and parasitic elements. Power consumption in computing devices, such as computers, laptops, tables, servers, smartphones, gaming machines, and the like, can have a substantial power budget allocated to main processor, graphics processor, or system-on-a-chip (SoC) elements. These processors can include more than one domain that segregates power consumption among particular portions of an integrated circuit device, such as to particular processing or graphics cores each having corresponding supply voltage requirements.

OVERVIEW

Thermal reduction and voltage adjustment techniques for computing systems and various devices are presented herein. In a first example, a method of operating a voltage control system for a processing device includes operating the processing device in a computing assembly at a selected performance level, the processing device supplied with at least one input voltage at a first voltage level. The method includes monitoring thermal information associated with the computing assembly, and when the thermal information indicates a temperature associated with the computing assembly exceeds a threshold temperature, adjusting the at least one input voltage level supplied to the processing device to a second voltage level lower than the first voltage level and continuing to operate the processing device at the selected performance level.

This Overview is provided to introduce a selection of concepts in a simplified form that are further described below in the Detailed Description. It may be understood that this Overview is not intended to identify key features or essential features of the claimed subject matter, nor is it intended to be used to limit the scope of the claimed subject matter.

BRIEF DESCRIPTION OF THE DRAWINGS

Many aspects of the disclosure can be better understood with reference to the following drawings. While several implementations are described in connection with these drawings, the disclosure is not limited to the implementations disclosed herein. On the contrary, the intent is to cover all alternatives, modifications, and equivalents.

DETAILED DESCRIPTION

Figure 1:
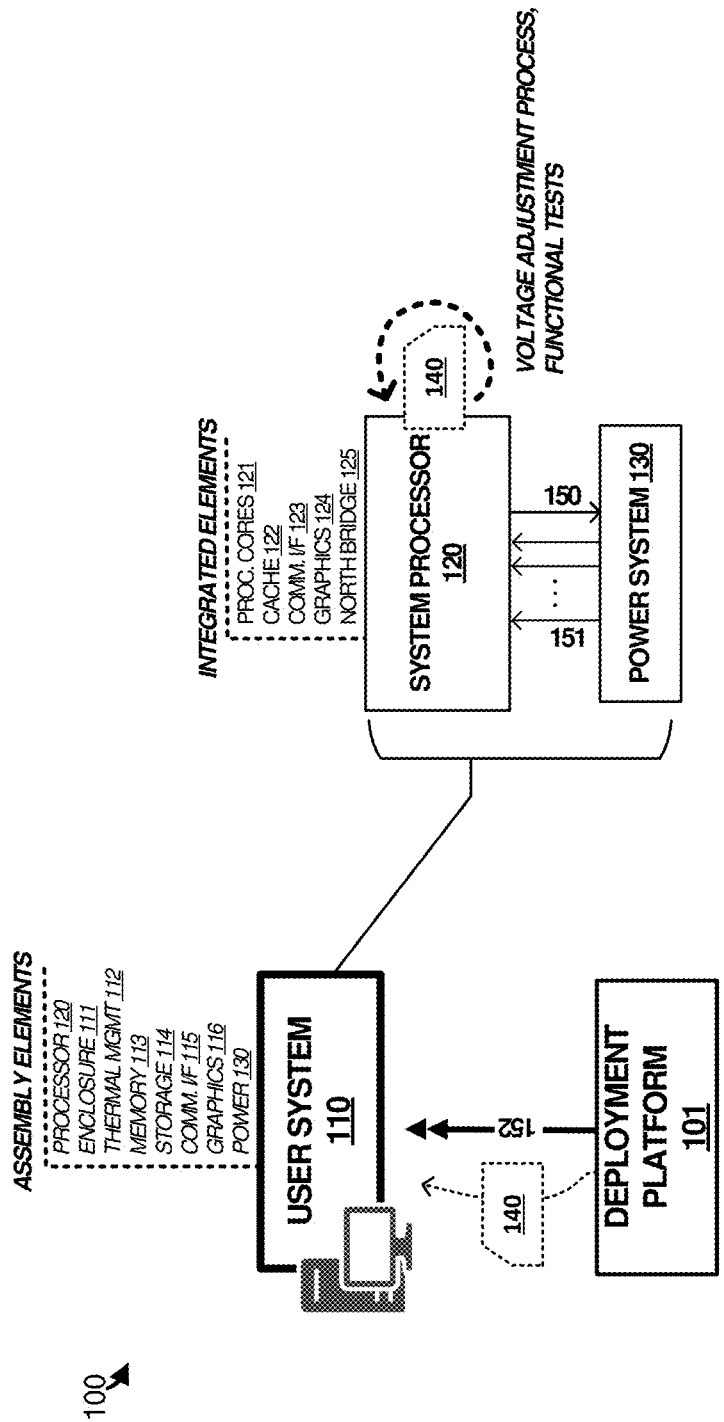
FIG. 1 illustrates a voltage adjustment environment in an implementation.

Power consumption in computing devices, such as computers, laptops, tables, servers, smartphones, gaming machines, and the like, can have a substantial power budget allocated to main processor or system-on-a-chip (SoC) elements. As processing demands increase in computing devices, associated power consumption has risen proportionally, leading to difficulties in device packaging, battery life, heat dissipation, fan noise, and speed limitations for associated computing devices. When integrated circuit devices, such as processors or processing devices, are manufactured, substantial voltage margins are included to account for part-to-part variation, system integration margins, and end-of-life (EoL) margins, among other margins. These margins allow for uniformity and ease of manufacturing testing, but have higher voltages and power consumptions. Operating at higher voltages and power consumptions in integrated circuits and associated equipment can lead to increased component stresses and lower component long-term reliability. Processing devices can also be manufactured using microfabrication processes which shrink feature geometries and produce associated decreases in device capacitance and decreases in operational voltage requirements, which can lead to reductions in power consumption. However, device leakage can become more of a problem with these smaller geometries.

These processing devices can also include more than one power domain that segregates power consumption among particular portions, such as to particular processing cores or graphics cores each having corresponding supply voltage requirements. Throttling of processing devices, such as by reducing/slowing an operating frequency or powering-down selective power domains, can be employed to reduce power consumption and reduce associated temperatures for the computing devices. Some examples of throttling or selective power down include restricting only AC power by disabling a clock or particular logic function while leaving DC power consumption unaffected. DC power consumption can be reduced by powering down portions of a processing device or the entire processing device. However, capabilities and performance of the processing devices are typically abridged during these throttling operations. Other power saving techniques are related to providing system-level voltage regulators and power supplies with improved operational efficiencies.

The various examples and implementations described herein advantageously provide for lower power consumption in processing devices and associated computing systems without altering performance levels of the processing devices and associated computing systems. Voltage reduction techniques are discussed for computing systems and processing devices to determine reduced operating voltages below manufacturer-specified voltages. These reduced operating voltages can lead to associated reductions in power consumption. Also, techniques and implementations illustrate various ways to employ these reduced operating voltages once determined, such as in systems with security features to restrict alteration of operating voltages or to assist in thermal management.

The voltage adjustment techniques herein exercise a processing device, such as a system-on-a-chip (SoC) device, in the context of various system components of a computing assembly. These system components can include one or more enclosures, thermal management elements (such as cooling fans, heatsinks, or heat pipes), memory elements (such as random access memory or cache memory), data storage elements (such as mass storage devices), and power electronics elements (such as voltage regulation or electrical conversion circuitry), among others, exercised during functional testing of the processing device. Moreover, the voltage adjustment techniques herein operationally exercise internal components or portions of a processing devices, such as processing core elements, graphics core elements, north bridge elements, input/output elements, or other integrated features of the processing device.

During manufacture of processing devices, a manufacturing test can adjust various voltage settings for a manufacturer-specified operating voltage for the various associated voltage domains or voltage rails of the processing device. When placed into a computing apparatus, such as a computer, server, gaming system, or other computing device, voltage regulation elements use these manufacturer-specified operating voltages to provide appropriate input voltages to the processing device. Voltage tables can be employed that relate portions of the processing device to manufacturer-specified operating voltages as well as to specific clock frequencies for those portions. Thus, a hard-coded frequency/voltage (F/V) table is employed in many processing devices which might be set via fused elements to indicate to support circuitry preferred voltages for different voltage domains and operating frequencies. In some examples, these fused elements comprise voltage identifiers (VIDs) which indicate a normalized representation of the manufacturer-specified operating voltages.

Built-in system test (BIST) circuitry can be employed to test portions of a processing device, but this BIST circuitry typically only activates a small portion of a processing device and only via dedicated and predetermined test pathways. Although BIST circuitry can test for correctness/ validation of the manufacture a processing device, BIST circuitry often fails to capture manufacturing variation between devices that still meets BIST thresholds. Manufacturing variations from device to device include variations in metal width, metal thickness, insulating material thickness between metal layers, contact and via resistance, or variations in transistor electrical characteristics across multiple transistor types, and all variations can have impacts on the actual results of power consumption in functional operation. Not only do these structures vary from processing device to processing device, but they vary within a processing device based on normal process variation and photolithography differences that account for even subtle attribute differences in all these structures. As a result, the reduced operating voltages can vary and indeed may be unique on each processing device. BIST also typically produces a pass/fail result at a specific test condition. This test condition is often substantially different from real system operation for performance (and power) such that it does not accurately represent system power and performance capability of the device. With large amounts of variability between a BIST result and a functional result, the voltages employed by BIST may be found sufficient for operation but might employ significant amounts of voltage margin. In contrast to BIST testing, the functional tests described herein employ functional patterns that activate not only the entire processing device but also other components of the contextually-surrounding system that may share power domains or other elements with the processing device.

In the examples herein, functional tests are employed to determine reduced operating voltages (Vmins) for a processing device, such as a system-on-a-chip (SoC) devices, graphics processing units (GPUs), or central processing units (CPUs). These functional tests run system-level programs which test not only a processing device, but the entire computing system in which the processing device is installed. Targeted applications can be employed which exercise the computing system and the processing device to ensure that particular processing units within the processing device are properly activated. This can include ensuring that all portions of the processing device are activated fully, a subset of units activated fully, or specific sets of background operations active in combination with targeted power-consuming operations.

In a specific example, an SoC is employed in a computing system. The SoC can comprise a central processing unit (CPU) with one or more processing cores, a graphics processing unit (GPU) with one or more graphics cores, a north bridge which handles communication between various cores, integrated memory, and off-SoC memory. Input/output portions are also included in the SoC to allow for communication with universal serial bus (USB) ports, peripheral component interconnect express (PCIe) links, mass storage interfaces, networking interfaces such as Ethernet or wireless networking, user interface devices, game controllers, and other devices communicatively coupled to the SoC. Multiple power domains can be employed in the SoC, such as a first one for the processing cores, a second one for the north bridge, and a third one for the graphics cores, among others. Each of these cores can be functionally tested in parallel to ensure traffic propagation and logical activation across core boundaries comprising both clock and voltage boundaries.

The functional tests for CPU portions can include operations initiated simultaneously on all the processing cores (or a sufficient number of them to represent a 'worst' possible case that a user application might experience) to produce both DC power demand and AC power demand for the processing cores that replicates real-world operations. Distributed checks can be provided, such as watchdog timers or error checking and reporting elements built into the processing device, and are monitored or report alerts if a failure, crash, or system hang occurs. A similar approach can be used for the GPU, where the functional test ensures the GPU and associated graphics cores focus on high levels of graphic rendering activity to produce worst case power consumption (DC and AC), temperature rises, on-chip noise, and a sufficient number of real data paths which produce accurate operational Vmins. North bridge testing can proceed similarly, and also include memory activity between off-device memory devices and on-chip portions that are serviced by those memory devices.

The power reduction using voltage adjustment processes herein can employ voltage regulation modules (VRMs) or associated power controller circuitry with selectable voltage supply values (such as in increments of 12.5 mV, 6.25 mV, 3.125 mV, and the like), where the processing device communicates with the VRMs or associated power controller circuitry to indicate the desired voltage supply values during an associated power/functional test or state in which the processing device may be operating.

Once reduced voltage values have been determined, the processing device can receive input voltages set to a desired reduced value from associated VRMs. This allows input voltages for processing devices to be set below manufacturer specified levels, leading to several technical effects. For example, associated power savings can be significant, such as 20-50 watts in some examples or 30% in other cases, and cost savings can be realized in the design and manufacturing of reduced capacity system power supplies, reductions in the VRM specifications for the processing devices, cheaper or smaller heat sinks and cooling fans. Smaller system enclosures or packaging can be employed. Additionally, the power savings can result in system characteristics that reduce electrical supply demands or battery drain.

Turning now to the various examples shown in the included drawings, FIG. 1 is presented which illustrates a voltage adjustment environment in an implementation. Specifically, FIG. 1 includes voltage adjustment environment 100. Environment 100 includes deployment platform 101 and user system coupled over one or more communication links, such as communication link 152. Further example systems and elements which can implement the features discussed for user system 110 are included in at least FIG. 4 and FIG. 7 below.

User system 110 includes several components detailed in FIG. 1. These components include system processor 120 and power system 130. System processor 120 can comprise one or more integrated elements, such as processor cores 121, cache memory 122, communication interfaces 123, graphics cores 124, and north bridge 125, among other integrated elements not shown for clarity. Furthermore, user system 110 can include assembly elements, namely enclosure elements 111, thermal management elements 112, memory elements 113, storage elements 114, communication interfaces 115, and graphics elements 116, among other elements not shown for clarity. When system processor 120 is installed in user system 110, these assembly elements provide system resources and context for the operation of system processor 120.

In operation, power system 130 provides one or more input voltages to system processor 120 over links 151. System processor 120 can request the one or more input voltages or change levels of the one or more input voltages over link 150. System processor 120 can then boot into an operating system (OS) once provided with input voltages to provide various operations of user system 110 including user applications, communication services, storage services, gaming services, or other features of a computing system. To establish the one or more input voltage levels, deployment platform 101 can transfer software 140 or related instructions to user system 110 over link 152, which performs a voltage adjustment process to determine reduced operating voltages for user system 110 or system processor 120.

Figure 2:
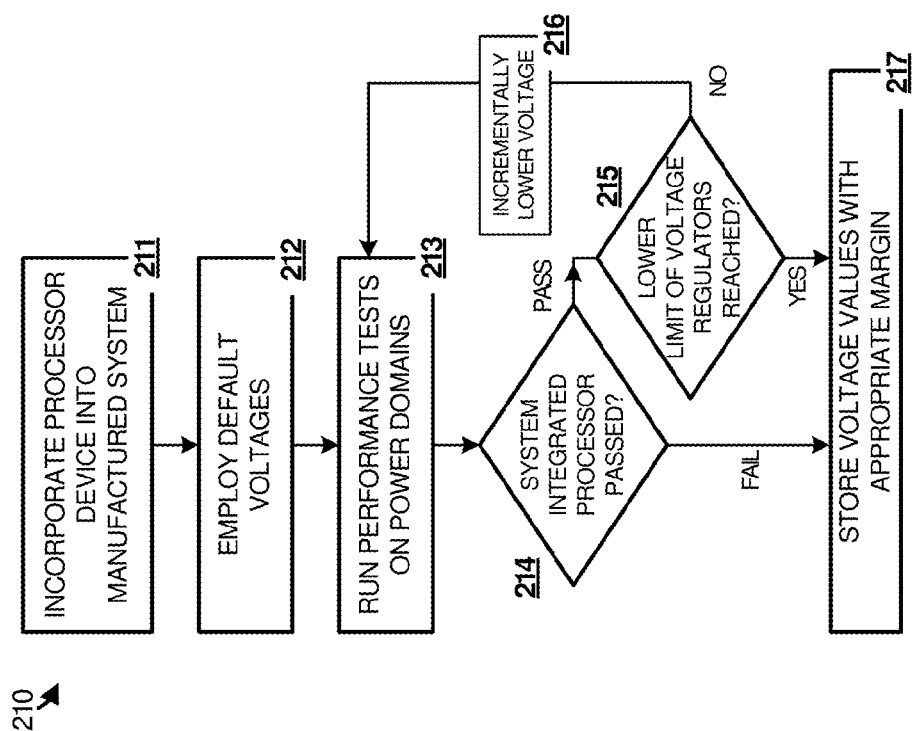
FIG. 2 illustrates a method of operating a voltage adjustment environment in an implementation.

FIG. 2 is included to illustrate operation of the voltage adjustment process. Specifically, FIG. 2 is a flow diagram illustrating a method of operating elements of environment 100 in an implementation. The voltage adjustment method discussed in FIG. 2 allows system processor 120 or associated user system 110, in concert with deployment system 101, to determine appropriate reduced input voltages for system processor 120, resulting in power savings for user system 110.

A processor device, such as system processor 120, is initially incorporated (211) into a manufactured system, namely user system 110. In FIG. 1, system processor 120 is shown installed into user system 110, such as on a motherboard or other circuit board of user system 110. User system 110 also includes many contextual assembly elements, as mentioned above. In many examples, user system 110 is a system into which system processor 120 is installed during a system assembly process before testing and shipment to a user. Thus, the hardware and software elements included in user system 110 might be the actual elements with which system processor 120 operates once installed at a user site.

User system 110 initially employs (212) default voltages to provide power to system processor 120. For example, power system 130 can provide input voltages over links 151 according to manufacturer-specified operating voltages, which can be indicated by VID information received from system processor 120 over link 150. In other examples, such as when progressively rising voltages are iteratively provided to system processor 120, the default voltages can comprise a starting point from which to begin raising voltage levels over time. In examples that employ incrementally rising voltages, starting voltages might be selected to be sufficiently low enough and less than those supplied by a manufacturer. Other default voltage levels can be employed. Once the input voltages are provided, system processor 120 can initialize and boot into an operating system or other functional state.

Deployment platform 101 might transfer one or more functional tests over link 152 for execution by system processor 120 after booting into an operating system. Deployment platform 101 can transfer software, firmware, or instructions over link 152 to user system 110 to initiate one or more functional tests of user system 110 during a voltage adjustment process. These functional tests can comprise performance tests that exercise the various integrated elements of system processor 120 as well as the various contextual assembly elements of user system 110. Portions of the voltage adjustment process or functional tests can be present before boot up to adjust input voltages for system processor 120, such as by first initializing a first portion of system processor 120 before initializing second portions. Further discussions of these portions are found below in FIGS. 7-8.

Once system processor 120 can begin executing the functional test, system processor 120 runs one or more performance tests on each of the power domains (213) of system processor 120. These power domains can include different input voltages and different input voltage levels. The functional tests can exercise two or more of the power domains simultaneously, which might further include different associated clock signals to run associated logic at predetermined frequencies. As mentioned above, the functional tests can include operations initiated simultaneously on more than one processing core to produce both DC power demand and AC power demand for the processing cores, graphics cores, and interfacing cores that replicates real-world operations. Moreover, the functional tests include processes that exercise elements of user system 110 in concert with elements of system processor 120, such as storage devices, memory, communication interfaces, thermal management elements, or other elements.

System processor 120 will typically linger at a specific operating voltage or set of operating voltages for a predetermined period of time. This predetermined period of time allows for sufficient execution time for the functional tests to not only exercise all desired system and processor elements but also to allow any errors or failures to occur. The linger time can vary and be determined from the functional tests themselves, or set to a predetermined time based on manufacturing/testing preferences. Moreover, the linger time can be established based on past functional testing and be set to a value which past testing indicates will capture a certain population of errors/failures of system processors in a reasonable time.

If system processor 120 and user system 110 do not experience failures or errors relevant to the voltage adjustment process during the linger time, then the specific input voltages employed can be considered to be sufficiently high to operate user system 110 successfully (214). Thus, the particular iteration of input voltage levels applied to system processor 120 is considered a 'pass' and another progressively adjusted input voltage can be applied. As seen in operation (216) of FIG. 2, input voltages for system processor 120 can be incrementally lowered, system processor 120 restarted, and the functional tests executed again for the linger time. A restart of processor 120 might be omitted in some examples, and further operational testing can be applied at a new voltage level for each linger timeframe in a continuous or repeating manner. This process is repeated until either lower limits of voltage regulators associated with power system 130 have been reached (215), or relevant failures of system processor 120 or user system 110 are experienced. This process is employed to determine reduced operating voltages for system processor 120 in the context of the assembly elements of user system 110. Once voltage adjustments for the associated power domains are found, indications of these voltage adjustments can be stored for later use at voltage 'minimums' (Vmins) in operation 217, optionally with margins appropriate for operational 'safety' to reduce undiscovered failures or errors during the functional testing.

The functional tests can comprise one or more applications, scripts, or other operational test processes that bring specific power domains up to desired power consumption and operation, which may be coupled with ensuring that user system 110 is operating at preferred temperature as well. These functional tests may also run integrity checks (such as checking mathematical computations or checksums which are deterministic and repeatable). Voltages provided by power system 130 can be lowered one incremental step at a time and the functional tests run for a period of time until a failure occurs. The functional tests can automatically handle all possible failure modes resulting from lowering the voltage beyond functional levels. The possible failures include checksum errors detected at the test application level, a kernel mode crash detected by the operating system, a system hang, or hardware errors detected by system processor resulting in "sync flood" error mechanisms, among others. All failure modes can be automatically recovered from for further functional testing. To enable automatic recovery, a watchdog timer can be included and started in a companion controller, such as a "System Management Controller" (SMC), Embedded Controller, or other control circuitry. The functional tests can issue commands to the companion controller to initialize or reset the watchdog timer periodically. If the watchdog timer expires or system processor 120 experiences a failure mode, the companion controller can perform a system reset for user system 110 or system processor 120. Failure modes that result in a system reset can prompt associated circuitry or companion controllers to initialize system processor 120 with 'default' or 'known good' voltage levels from power system 130. These default levels can include manufacturer specified voltages or include voltage levels associated with a most recent functional test 'pass' condition.

Once user system 110 initializes or boots after a failure during the functional tests, the failure can be noted by a failure process in the functional tests or by another entity monitoring the functional tests, such as deployment platform 101. The voltage level can then be increased a predetermined amount, which might comprise one or more increments employed during the previous voltage lowering process. The increase can correspond to 2-3 increments in some examples, which might account for test variability and time-to-fail variability in the functional tests.

The voltage values determined from the voltage adjustment process can be stored into a memory device or data structure along with other corresponding information, such as time/date of the functional tests, version information for the functional tests, or other information. The version identifier can be used to enable "in field" special handling of results determined by different revisions of user system 110. This data structure can be securely signed by a hardware security module (HSM) to ensure that the stored voltage information and related information is authentic. A digital signature for the data structure can be validated during each subsequent boot of user system 110, and the stored voltage information can be used as the selected operational voltage for the remainder of any factory/manufacturing tests and subsequent user site operation. Further examples of secure voltage handling are discussed in FIG. 8.

The resulting user system characteristics (e.g. power levels, battery operation, system attributes) are substantially improved after the voltage adjustment process is completed. Thus, the voltage adjustment process described above allows user systems to individually 'learn' appropriate reduced operating voltages during a manufacturing or integration testing process. Examples of in situ voltage adjustment processes are described below in FIG. 4.

The iterative voltage search procedure can be repeated independently for each power domain and for each power state in each domain where power savings are to be realized. For example, a first set of functional tests can be run while iteratively lowering an input voltage corresponding to a first voltage/power domain of system processor 120. A second set of functional tests can then be run while iteratively lowering a second input voltage corresponding to a second voltage/power domain of system processor 120. When the second set of functional tests are performed for the second input voltage, the first voltage can be set to a value found during the first functional tests or to a default value, among others.

Advantageously, end-of-line (EoL) voltage margin need not be added during manufacturing test or upon initial shipment of user system 110. EoL margin can be added if desired, such as 10 to 50 millivolts (mV), among other values, or can be added after later in-situ testing described below. EoL margins are typically added in integrated circuit systems to provide sufficient guardband as associated silicon timing paths in the integrated circuit slow down over time with use. Although the amount of margin typically employed for EoL is only perhaps 15-30 mV (depending upon operating conditions, technology attributes, and desired life time), the systems described herein can eliminate this margin initially, either partially or entirely. In some examples, an initial voltage margin is employed incrementally above the Vmin at an initial time, and later, as the system operates during normal usage, further EoL margin can be incrementally added proportional to the total operational time (such as in hours) of a system or according to operational time for individual voltage domains. Thus, extra voltage margin is recovered from system processor 120 after the initial voltage adjustment process, and any necessary margin for EoL can be staged back over the operational lifetime of user system 110. Moreover, by operating a user system at lower voltages for a longer period of time, system reliability is further improved and system acoustic levels are also more desirable, since lower power levels mean lower average fan speeds will be required to cool the system. These acoustic benefits might taper off over the course of time as the EoL margin is staged back in, but it will improve the initial customer experience.

In further examples, the process described above can be conducted in an exemplary or model user system, with system processor 120 included in a socket or socketed configuration. This alternate method can be used instead of the previous one listed or in addition to it. In this example, the reduced voltages are determined during the device manufacturing process through the use of a socketed system that is utilized for system processor testing. In this example, the voltage adjustment process occurs in a socketed system before system processor 120 is assembled in a manufacturing process into a final user system 110, such as with other system components in a final assembly. Although some voltage adjustment can occur in the socketed system, a normalized or modeled additional or lesser margins can be removed/added from the final results of the socketed test to account for variation in the final assembly hardware/software. The final voltage levels found might be stored either in non-volatile memory of system processor 120, or in another system which later transfers the final voltage levels into a final assembly. Another, abbreviated, final integration voltage adjustment test can occur to validate the socketed testing results. Alternatively, the socketed testing can establish a default or baseline voltage from which the fully-integrated system can use during another voltage adjustment process.

Figure 3:
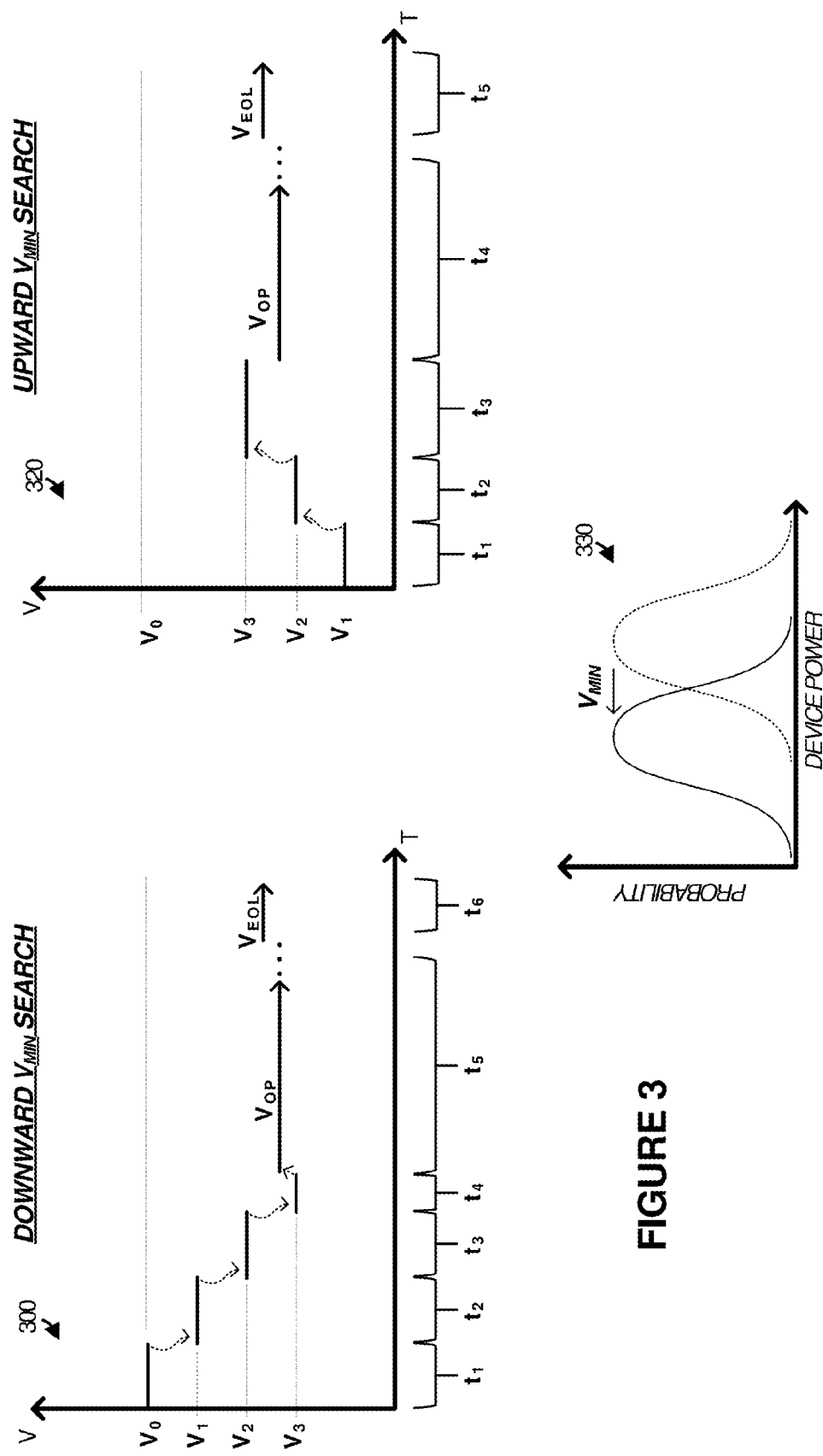
FIG. 3 includes graphs illustrating voltage and power reduction in an implementation.

FIG. 3 illustrates various graphs that show how a voltage adjustment process might progress, namely graph 300 and graph 320. Graph 300 shows a 'downward' incremental Vmin search using progressively lowered voltages, with safety margin added at the end of the process to establish an operational voltage, $V_{OP}$. Later margin ($V_{EOL}$) can be staged in to account for EoL concerns. Specifically, graph 300 shows a default or initial voltage level $V_0$ applied to a processor device. After a linger time for a functional test, a successful outcome prompts an incremental lowering to $V_1$ and retesting under the functional test. Further incremental lowering can be performed for each successful iteration of the functional test for an associated time indicated in graph 300. Finally, a lowest or reduced operating voltage is found at $V_3$ and optional margin is applied to establish $V_{OP}$. $V_{OP}$ is employed for the normal operation of the processing device for a period of operational time indicated by $t_5$. This time can occur while an associated system is deployed on-site. After a designated number of hours indicated by $t_5$, EoL margin can be staged in to established $V_{EOL}$. Multiple stages of EoL margin can occur, although only one is shown in graph 300 for clarity.

In contrast to the downward voltage search in graph 300, graph 320 illustrates an upward voltage search process. Graph 320 shows an increasing incremental Vmin search using progressively raised voltages to establish an operational voltage, $V_{OP}$. Later margin ($V_{EOL}$) can be staged in to account for EoL concerns. Specifically, graph 320 shows a manufacturer specified voltage level at $V_0$, and an initial test voltage level $V_1$ applied to a processor device. After a linger time for a functional test at $V_1$, a failed test outcome prompts an incremental raising to $V_2$ and retesting under the functional test. Further incremental raising can be performed for each unsuccessful test iteration of the functional test for an associated time indicated in graph 300. Finally, a successful operating voltage is found at $V_3$ where the functional tests indicate a 'pass' condition. Since the increments might be of a large granularity, the operational voltage might be established by a brief test at a slightly lower voltage to establish $V_{OP}$, or $V_{OP}$ can be set to $V_3$ in other examples. $V_{OP}$ is employed for the normal operation of the processing device for a period of operational time indicated by $t_4$. This time can occur while an associated system is deployed on-site. After a designated number of hours indicated by $t_4$, EoL margin can be staged in to established $V_{EOL}$. Multiple stages of EoL margin can occur, although only one is shown in graph 320 for clarity.

The voltage levels indicated in FIG. 3 can vary and depend upon the actual voltage levels applied to a processing device. For example, for a device operating around 0.9V, a reduced voltage level can be discovered using the processes in graphs 300 or 320. Safety margin of 50 mV might be added in graph 300 to establish $V_{OP}$ and account for variation in user applications and device aging that will occur over time. However, depending upon the operating voltage, incremental step size, and aging considerations, other values could be chosen.

The processes in graphs 300 and 320 can be executed independently for each power supply or power domain associated with a processing device. Running the procedure on one power supply or power domain at a time can allow for discrimination of which power supply or power domain is responsible for a system failure when looking for the Vmin of each domain. However, lowering multiple voltages for power supplies or power domains at the same time can be useful for reducing test times, especially when failure can be distinguished among the various power supplies or power domains. In further examples, a 'binary' voltage adjustment/search algorithm can be used to find the Vmin by reducing the voltage half way to an anticipated Vmin as opposed to stepping in the increments of graphs 300 or 320. In such examples, a Vmin further testing might be needed by raising the voltage once a failure occurred and successfully running system tests at that raised value. Other voltage adjustment/search techniques could be used and the techniques would not deviate from the operations to establish a true Vmin in manufacturing processes that can then be appropriately adjusted to provide a reasonable margin for end user operation.

Also included in FIG. 3 is graph 330. Graph 330 illustrates potential power savings for a population of processing devices. As a Vmin is established for each processing device, the population of power consumptions for the processing devices indicated by the 'Gaussian' distribution will shift to the left, indicating a lower overall power consumption for the devices. It should be noted that in examples without 'normal' distributions of devices, a shift in the population of power consumption can also occur for those distributions.

Returning to the elements of FIG. 1, deployment platform 101 comprises a platform from which voltage adjustment process 140 is staged, and failures or successes of the functional test are monitored. Deployment platform 101 can include communication interfaces, network interfaces, processing systems, computer systems, microprocessors, storage systems, storage media, or some other processing devices or software systems, and can be distributed among multiple devices or across multiple geographic locations. Examples of deployment platform 101 can include software such as an operating system, logs, databases, utilities, drivers, networking software, and other software stored on a computer-readable medium. Deployment platform 101 can comprise one or more platforms which are hosted by a distributed computing system or cloud-computing service. Deployment platform 101 can comprise logical interface elements, such as software defined interfaces and Application Programming Interfaces (APIs).

User system 110 and deployment platform 101 can communicate over one or more communication link 152. In some examples, communication link 152 comprise one or more network links, such as wireless or wired network links. Other configurations are possible with elements of user system 110 and deployment platform 101 communicatively coupled over various logical, physical, or application programming interfaces. Example communication links can use metal, glass, optical, air, space, or some other material as the transport media. Example communication links can use various communication interfaces and protocols, such as Internet Protocol (IP), Ethernet, USB, Thunderbolt, Bluetooth, IEEE 802.11 WiFi, or other communication signaling or communication formats, including combinations, improvements, or variations thereof. Communication links can be direct links or may include intermediate networks, systems, or devices, and can include a logical network link transported over multiple physical links.

User system 110 comprises a computing system or computing assembly, such as a computer, server, tablet device, laptop computer, smartphone, gaming system, entertainment system, storage system, or other computing system, including combinations thereof. User system 110 includes several components detailed in FIG. 1. These components include system processor 120 and power system 130. Furthermore, user system 110 can include assembly elements, namely enclosure elements 111, thermal management elements 112, memory elements 113, storage elements 114, communication interfaces 115, and graphics elements 116, among other elements not shown for clarity. Enclosure elements 111 can include structural support elements, cases, chassis elements, or other elements that house and structurally support the further elements of user system 110. Thermal management elements 112 can include heatsinks, fans, heat pipes, heat pumps, refrigeration elements, or other elements to manage and control temperature of user system 110. Memory elements 113 can comprise random-access memory (RAM), cache memory devices, or other volatile memory elements employed by system processor 120. Storage elements 114 comprise non-volatile memory elements, such as hard disk drives (HDDs), flash memory devices, solid state drives (SSDs), or other memory devices which store operating systems, applications, or other software or firmware for user system 120. Communication interfaces 115 can include network interfaces, peripheral interfaces, storage interfaces, audio/video interfaces, or others which communicatively couple user system to external systems and devices. Graphics elements 116 can include display interfaces, displays, touchscreens, touch interfaces, user interfaces, among others.

Power system 130 typically includes voltage regulator circuitry, controller circuitry, power filtering elements, power conditioning elements, power conversion elements, power electronics elements, or other power handling and regulation elements. Power system 130 receives power from an external source, such as from batteries or an external power source, and converts/regulates the power to produce voltages and currents to operate the elements of user system 110.

Figure 4:
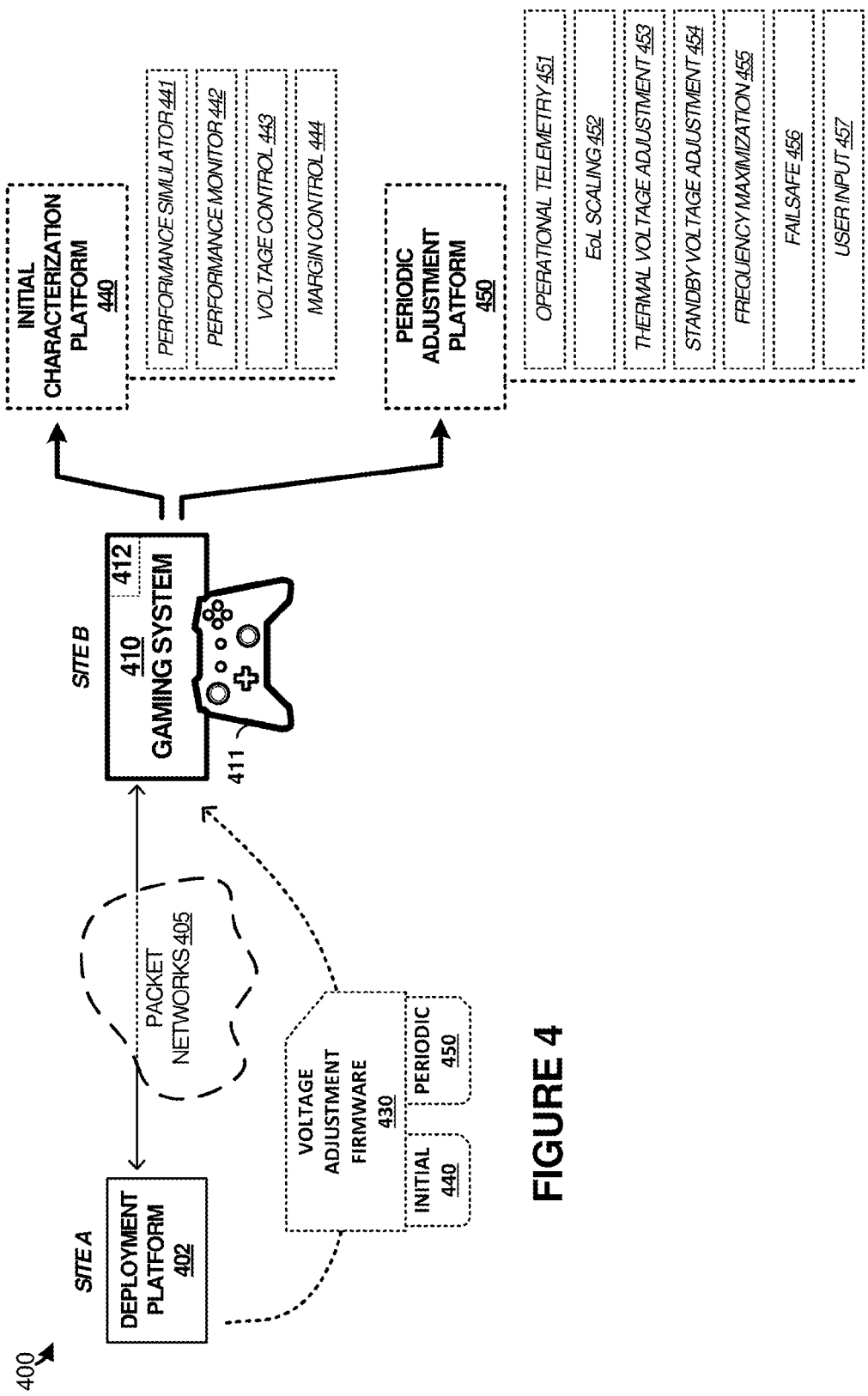
FIG. 4 illustrates a voltage adjustment environment in an implementation.

As a further example of voltage adjustment processes, FIG. 4 is presented. FIG. 4 discusses on-site or in-situ voltage adjustment of a user system. Although the discussion below for FIG. 4 is in the context of a deployment platform and user system that are located at sites remote from each other, it should be understood that features discussed above for the manufacturing testing-based voltage adjustment can apply in FIG. 4, and vice versa.

FIG. 4 illustrates voltage adjustment environment 400 in an implementation. Environment 400 includes deployment platform 402, one or more packet networks 405, gaming system 410. In this example, a user system comprises a gaming system, although any user system mentioned herein might instead be employed. Moreover, gaming system 410 includes user interface devices, such as gaming controller 411, along with one or more processing devices 412. Other elements of a user system, such as a power control system, are included but omitted in FIG. 4 to focus on voltage characterization platform elements. Further example systems and elements which can implement the features discussed for gaming system 410 are included in at least FIG. 1 above and FIG. 7 below.

Deployment platform 402 located at site 'A' which is remote from site 'B' of gaming system 410. Deployment platform 402 and gaming system 410 communicate over one or more packet networks 405 and associated links. For example, site 'A' can be a vendor site or distributed computing platform and site 'B' can be a customer or user location, such as a business, residence, or other location. Initially, gaming system 410 might not have been adjusted for operating with voltages lower than manufacturer specified voltages for processing device 412 when installed in gaming system 410. Deployment platform 402 can transfer voltage adjustment firmware 430 for delivery to gaming system 410. Gaming system 410 can then execute elements of voltage adjustment firmware 430 to determine adjusted operating voltages for processing device 412 of gaming system 410.

Figure 5:
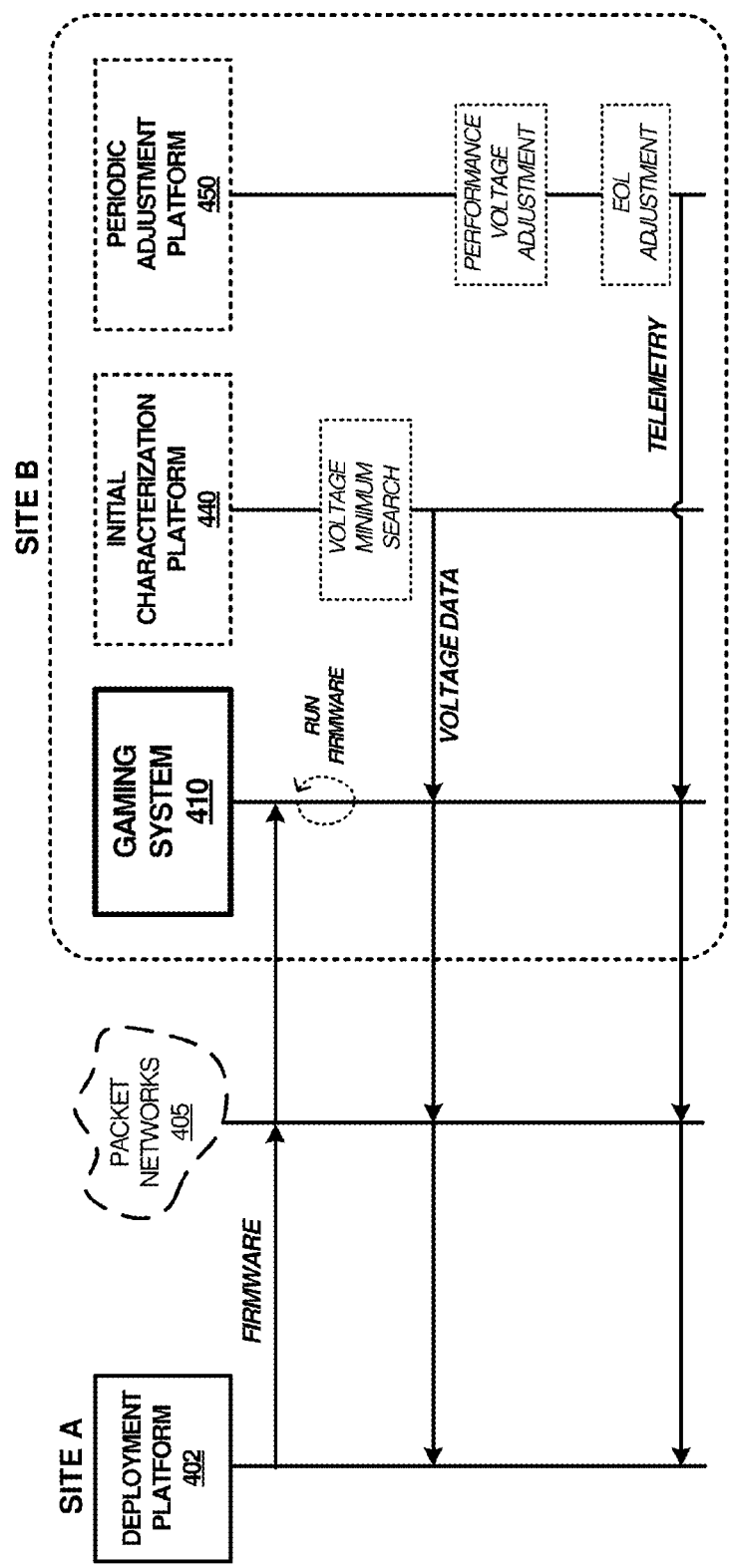
FIG. 5 illustrates operation of a voltage adjustment environment in an implementation.

FIG. 5 is included to show example operations of elements of system 400. In FIG. 5, deployment platform 402 transfers voltage adjustment firmware 430 for delivery to gaming system 410 over packet networks 405. Gaming system 410 receives voltage adjustment firmware 430 and executes voltage adjustment firmware 430 to provide voltage adjustment features to gaming system 410, such as provided by initial characterization platform 440 and periodic adjustment platform 450. For example, initial characterization platform 440 can be executed to perform a voltage search for processing device 412. Resultant voltage data, such as voltage levels found from the voltage search, can be transferred to storage elements of gaming system 410 or to deployment platform 402. Further voltage adjustment processes can be handled by periodic adjustment platform 450, which can provide performance-based voltage adjustments and EoL voltage adjustments to processing device 412, or determine telemetry data derived from monitoring performance data or operational statistics of gaming system. This telemetry data can be transferred for delivery to gaming system 410 for storage or to deployment platform 402 for comparison with other gaming systems, data analysis, archival, or other processing.

As mentioned above, voltage adjustment firmware 430 can comprise an initial characterization platform 440 and periodic adjustment platform 450. Elements of platforms 440 and 450 can be operated in parallel to achieve the various functions discussed herein. Voltage adjustment firmware 430 may be implemented in program instructions and among other functions may, based at least in part on execution by gaming system 410, gaming system 410 to operate as described with respect to the various operational scenarios, sequences, and processes illustrated herein. For example, voltage adjustment firmware 430 may include program instructions comprising initial characterization platform 440 that establishes reduced operating voltages for processor device 412, among other functions. Voltage adjustment firmware 430 may include program instructions comprising periodic adjustment platform 450 that establishes adjustments to the reduced operating voltages for EoL margins, and also allows for voltage adjustment in various scenarios, among other functions.

Turning now to the specific modules of initial characterization platform 440, the modules include performance simulator 441, performance monitor 442, voltage control 443, and margin control 444. Performance simulator 441 comprises one or more functional tests that exercise elements of processing device 412, such as processing cores, graphics cores, communication elements, memory elements, among other elements. Performance simulator 441 also exercises processing device 412 in context with elements of gaming system 410, such as storage drives, RAM, graphics cards, communication interfaces, fans, enclosures, heat management elements, power supply elements, and the like. As discussed above for the functional tests in FIGS. 1-2, these functional tests allow a rigorous operational test of gaming system 410 during incremental adjustments to supply voltages for processing device 412. Voltage control module 443 allows for control of adjustments to supply voltages provided by a power system of gaming system 410 to processing device 412. During the operational testing provided by performance simulator 441, performance monitor 442 provides for monitoring for failures, crashes, overloads, or other conditions which might indicate that a voltage supplied to processing device 412 is currently at too low of a level for proper operation. Margin control module 444 can determine margin to add after reduced voltages have been found for processing device 412 in gaming system 410. The margin can vary based on lifetime of gaming system 410 (in examples where gaming system 410 already has a number of operational hours), components and elements included in gaming system 410, projected usage patterns, past usage patterns, or other factors, including combinations thereof. The margin added to each reduced voltage can vary based on the voltage domain, on the failures noted in the operational testing, or can be predetermined values, among other values.

Initial characterization platform 440 can be executed during a boot period of gaming system 410, at a time when gaming system 410 is being upgraded to a new version of operating system or gaming platform software, or at another scheduled time when gaming system 410 can devote time to non-user functions. Performance simulator 441 is loaded onto gaming system to stress associated power demand and input voltages for processing device 412, and the input voltages are lowered until one or more failures occur. The voltages at which the system fails (or last known voltage at which the system ran successfully) are noted and used to establish new reduced operating voltages for processing device 412. Margin, such as 10-20 mV from these reduced operating voltages can be added for operational safety, and approximately 50 mV of margin for application-to-application guardband and EoL degradation. If a small amount of guardband is desired for potential temperature effects (such as 10-20 mV), that additional guardband could be added as well. All of the specific voltage values noted herein are for illustrative purposes and can be adjusted as needed due to actual voltage levels and appropriate amounts of guardband that vary with technology and over time. Once a reduced value is found and appropriate margin included, final operational voltage(s) can be stored in non-volatile storage devices and used for subsequent system operation.

Turning now to the specific modules of platform 450, the modules include operational telemetry module 451, EoL scaling module 452, thermal voltage adjustment module 453, standby voltage adjustment module 454, frequency maximization module 455, failsafe module 456, and user input module 457.

Telemetry module 451 monitors and stores operational statistics, voltage settings, power consumptions, operational hours, workload statistics, or other information for gaming system 410. Telemetry data can help determine the relative stability of system operation for each voltage setting by at least tracking what system and voltage adjustment features are being used and what happens to an associated crash rate as a result. Telemetry also indicates if the lower voltage settings actually reduce the system crash rate due to the improved reliability characteristics associated with the lower voltages and temperatures. Telemetry data can be stored in gaming system 410, such as in logs or databases held in non-volatile memory devices, and can be transferred for delivery to deployment platform for further analysis and storage. EoL scaling module 452 can track operational hours or operational stress rates of processing device 412, such as in conjunction with telemetry data, and establish EoL voltage margins to compensate for EoL degradations over time. A table of voltage margins related to operational hours or other factors can be maintained by gaming system 410 for usage in applying EoL margin.

Thermal voltage adjustment module 453 can operate processing device 412 with input voltages at a level above the reduced levels determined previously and scale the voltages downward in response to temperature levels or power consumption levels of gaming system 410. For example, in addition to the guardband or EoL margins discussed herein, a thermal voltage adjustment margin can be applied. This thermal voltage adjustment margin might operate gaming system 410 at a higher than 'minimum' or non-reduced power consumption, but as temperatures increase in an enclosure of gaming system this additional thermal voltage adjustment margin might be reduced to provide lower power operation—and thus lower corresponding temperatures. For example, gaming system 410 might be operated at a manufacturer-specified voltage level until thermal levels indicate adjustment is desired, and a reduced operating voltage can be applied according to a Vmin level determined previously. A further discussion of thermal voltage adjustment is found in FIG. 6 below.

Standby voltage adjustment module 454 can also reduce voltages applied to processing device 412 in response to portions of processing device 412 or gaming system 410 entering into an idle or inactive state. In many cases, a reduced voltage level is established which prevents crashes or other failures of gaming system 410 during normal operation. However, when portions of gaming system are in a standby mode, reduced voltage margins or other reduced voltage levels can also be applied for these modes. For example, the initial characterization can also determine reduced voltages or reduced margins for idle states or other modes of processing device 412. Each voltage domain can be monitored individually for operational status and voltage levels adjusted accordingly.

Frequency maximization module 455 provides for enhanced performance of gaming system 410 in examples where greater than normal clock frequencies are desired. The greater clock frequencies can provide faster operation of associated logic, memory, and communication elements of processing device 412. However, added power consumption usually accompanies increased clock frequencies. Similar to the thermal adjustment margin discussed above, an additional margin can be applied to allow for frequency scaling beyond a guardband or EoL margin. Increases in performance by increasing clock frequency also cause increases in power consumed at a fixed voltage. However, voltage can be lowered while increasing frequency at the same time if gaming system 410 desires to keep a power consumption constant or within predetermined limits. A process to determine Vmins can still use original system frequencies. However, a relationship between voltage and frequency (approximately 1% in voltage for every 1.5% in frequency) and the nature of how both voltage and frequency affect power consumption (leakage and AC power together follow approximately a "voltage cubed times frequency" formula) can allow the voltage margin to be turned into extra performance at a constant power target. In this situation, if computing systems can tolerate different performance values, each system can be adjusted independently for these different performance values, similar to adjustments for voltage levels.

Failsafe module 456 provides for failsafe mechanisms or control of watchdog elements that are employed to ensure that when gaming system 410 is operating below manufacturer specified voltages, the voltages can be subsequently increased in the event system operation becomes erratic, unstable, or experiences failures. Specifically, in user systems where a voltage has been set below a device manufacturer specified value on one or more power supply rails, the voltage can be recovered to a higher value if system stability (i.e. a number of system crashes or hangs) exceeds a predetermined value or some predetermined threshold. This failsafe fallback methodology allows the system to increase the voltage by a small value, an intermediate value, or recover to the manufacturer specified voltage in an attempt to restore stable system operation before noting the user system as a field failure. After a field failure and subsequent fallback, the user system can continue to operate at the fallback voltage levels, or might instead be prompted for return to a manufacturer for replacement or repair.

User input module 457 provides for user input methods via one or more user interface elements for allowing a user or operator to alter voltage properties or other properties of gaming system 401. User input module 457 can communicate through user interface elements of gaming system 410, or provide specialized APIs for receiving user input from user input devices, graphical user interfaces, or via network-based user interfaces. In some examples, voltages can be lowered according to user instructions or user control. A user-controllable setting can be established by gaming system 410 to allow a user to reduce system voltages to levels below manufacturer specified levels. However, the watchdog and failsafe features herein can be employed to prevent a system from becoming inoperable during such user voltage adjustments. In yet further examples, power savings might be more important than reliability or stability of a system, and margins might be excluded to gain additional power savings. Failures during the functional testing might be ignored if of a certain non-fatal nature (i.e. graphic rendering errors) to allow for even lower voltage operation. Varying guardbands might be selectable by a user to allow the user control over how much power savings vs. system stability is desired. Reliability and power savings improve with lower operating voltages, but stability can be affected if too low of operating voltages are selected. For example, a first guardband can provide low-power consumption [i.e. 75 mV guardband], a second guardband can provide even lower power consumption [i.e. 50 mV guardband], and a third guardband can provide ultralow-power consumption [i.e. 25 mV guardband]. Other levels and guardbands can be selected.

FIG. 4 illustrates voltage adjustment techniques in existing systems where either through self-contained firmware code or through online updates, processor voltage levels are reduced incrementally until a safe operating floor is reached. This methodology accomplishes the power reduction in a user environment without the utilization of manufacturing system test equipment and platforms. Instead of (or in addition to) lowering the operating voltages for a processor device, the example in FIG. 4 utilizes the voltage lowering techniques in a consumer environment by running one or more scripts that perform a Vmin search on each of the power/voltage domains where a reduction is desired. The scripts might be run responsive to each boot of gaming system 410, or might instead be scheduled or periodically executed to reduce delays in boot times.

The control for lowering the voltages and reducing power consumption, however, might be executed after manufacture and delivery of gaming system 410, and thus improvements to component sizes, such as fans, enclosures, heat sinks, and the like, might not be realized. Regardless, user systems in this case do realize power savings and improved reliability characteristics after operating at lower voltage levels, lower power levels, and likely cooler temperatures. Also, the user systems are likely to have improved acoustic characteristics as the system operates below the cooling capability inherent in the design. Other advantages include reducing a power footprint of server farms or large computing centers where many computing systems are deployed. The power consumption savings gained by reducing operational voltages of processing devices below manufacturer specified levels can lead to reduced data center power demands and cooling requirements. However, since the voltage adjustment process might occur in a user site environment where the ambient temperature might not be controlled (in contrast to a manufacturing environment), user site temperature may have an impact on the power savings that can be realized. Some devices have worse performance at maximum temperature while others may be limited at minimum temperature (i.e. temperature inversion characteristics in devices operating at lower voltages). Although an environmental and enclosure temperature might be able to be known in the user environment, there are limits on being able to control it as is done in a manufacturing environment.

Figure 6:
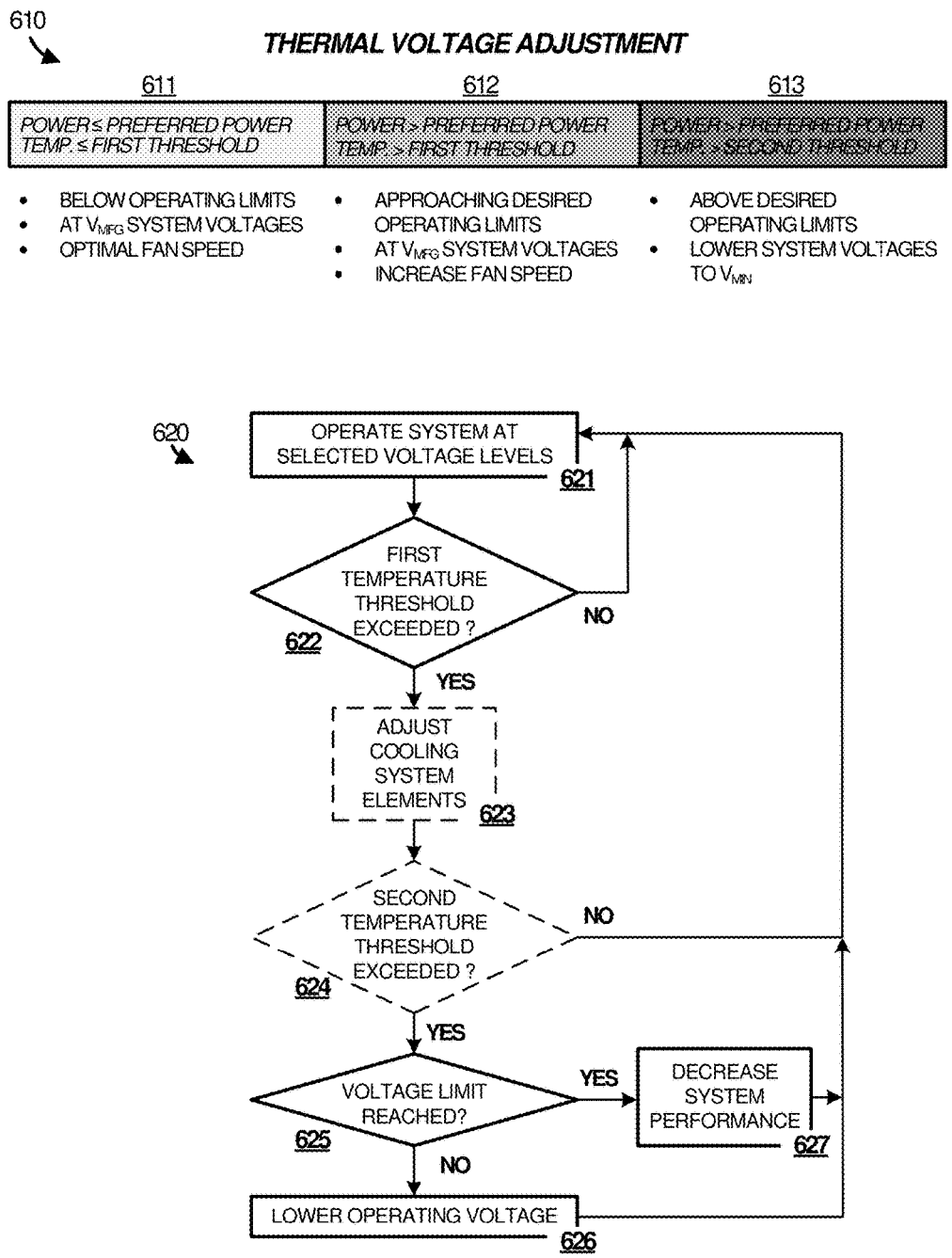
FIG. 6 illustrates operation of thermal voltage adjustment in an implementation.

Turning now to FIG. 6, several examples are provided for operation of computer systems and associated processing devices to allow for thermal-based adjustment of voltage. Although the examples in FIG. 6 illustrate thermal or temperature-based voltage adjustments, similar principles can be applied for power consumption-based voltage adjustments. Other factors can be used to adjust voltage as well, such as standby mode status or cooling system status. The operations of FIG. 6 can be performed by any of the processing devices discussed herein, such as by thermal voltage adjustment module 453 executed by processing device 412.

Table 610 includes three thermal regimes 611-613 in which a computing system can operate. A first regime 611 is defined where power consumption is less than or equal to a preferred power threshold or a system temperature is less than or equal to a first threshold temperature. The temperature can be measured for the entire system, such as for temperature inside of an associated enclosure, or might instead be measured for a specific integrated circuit, such as for a silicon die temperature of a processing device. In this first regime 611, the computing system is operating below desired operating limits and might be operating at manufacturer specified voltages or at voltage levels with associated thermal adjustment margins applied above a Vmin. Also, any associated fans or cooling system elements are operating at optimal levels.

If the temperature increases, a second regime 612 might be entered. The temperature might increase due to ambient temperature increases, increased workloads or power dissipations of elements of the associated computing system, or due to other factors. The second regime 612 is defined where power consumption is greater than a preferred power threshold or a system temperature is greater than the first threshold temperature. In this second regime 612, the computing system is approaching desired operating limits and might still be operating at manufacturer specified voltages (or at a voltage level with associated thermal voltage lowering margins applied to a minimum operating voltage). Also, any associated fans or cooling system elements are operating at increased levels as compared to the first regime.

If the temperature continues to increases, a third regime 613 might be entered. The temperature might increase even further due to ambient temperature increases, increased workloads or power dissipations of elements of the associated computing system, or due to other factors. The third regime 613 is defined where power consumption is greater than a preferred power threshold or a system temperature is greater than a second threshold temperature which is higher than the first temperature threshold. In this second regime 612, the computing system is above desired operating limits and voltage levels for a processing device are scaled back to lower levels. These lower voltage levels might correspond to the reduced voltages determined previously or begin to reduce associated thermal voltage lowering margins. Also, any associated fans or cooling system elements might be operating at maximum levels as compared to the first and second regimes.

It should be noted that through all three regimes of table 610, no operational performance degradations or performance throttling to a processing device are employed. Since a voltage margin was included in the first regime, increases in temperature can be countered by lowering input voltages to the processing device while leaving any operational performance parameters (such as operating frequencies, idling states, active states, workloads, throughputs, bandwidths, or other parameters) unaffected and operating at optimal levels.

To further illustrate thermal-based adjustment of voltage levels, flow diagram 620 is included. In diagram 620, a processing device operates (621) the computing system at selected voltage levels. These selected voltage levels can initially be default values, manufacturer specified voltage levels, or reduced voltage levels with thermal margins applied, among other values. As seen in the further operations of diagram 620, the selected voltage levels can change due to increased temperature. Once a first temperature threshold is exceeded (622), such as found in regime 612, the processing device can adjust (623) cooling system elements to compensate for the increased temperature. Adjusting the cooling system elements can include adjusting fan speeds, louver positions, heat sink parameters, climate control system parameters, heat pump settings, or other adjustments, including combinations thereof. If a second temperature threshold is exceeded (624), then the processing device can lower (626) an operating voltage for the processing device, such as by instructing voltage regulation elements to reduce levels of voltages supplied to the processing device. These voltage levels can be incrementally lowered to attempt to alleviate temperatures increases in steps. In the operations above, when a voltage level is decreased to compensate for increased temperature, performance of the processing device is maintained and not throttled. However, if a voltage minimum limit is reached (625) then the voltages might not be able to be lowered further to compensate for temperature increases. Responsive to the voltage minimum limit being reached, the processing device can decrease or throttle (627) system performance to alter a clock speed, idle portions of the processing device, power down various contextual elements of the computer system, or even power down the entire system in extreme cases. It should be noted that, unlike in operation 627, the voltage adjustment techniques of operation 626 do not degrade or throttle performance of the processing device. After a period of time when a temperature or power consumption level has decreased, then operating voltages and other adjustments for the processing device can be returned incrementally or returned back to an initial or default level.

In further examples, techniques for increasing the operational frequency of systems is provided. For example, frequency maximization module 455 provides for enhanced performance of gaming system 410. In these further examples, voltage margins are employed to increase system performance instead of lowering system power consumption. Increases in performance by increasing a clock frequency also can cause increases in power consumed at a fixed voltage. However, voltage can be lowered while increasing frequency at the same time if a power consumption cap or limit is desired. In this situation, Vmins can still be found at the original system frequency, as discussed herein. However, a relationship between voltage and frequency (approximately 1% in voltage for every 1.5% in frequency) and the nature of how both voltage and frequency affect power consumption (leakage and AC power together follow approximately a "voltage cubed times frequency" formula) can allow the voltage margin to be turned into extra performance at a constant power target. In this situation, if computing systems can tolerate different performance values, each system can be adjusted independently for these different performance values, similar to reductions for voltage levels. Although these performance increases can be applied to devices during a manufacturing process, these performance increases can also be achieved in-situ using firmware deployed to a user site.

For this particular example, the operating minimum voltages found with the procedures noted above are employed dynamically to extract extra performance from a system without increasing power consumption levels. This extra performance can be achieved by increasing a clock frequency associated with a particular voltage or voltage domain. Since maximum power in many examples is focused on system thermal characteristics, thermal response time of a system is such that a voltage can be adjusted without adversely impacting the maximum power being consumed from a thermal perspective. Voltage adaptation is accomplished via monitoring either processing device activity levels through on-device performance monitors or monitoring associated voltage regulator currents, voltages, or power levels. Depending upon voltage differences between the operational minimum values (with appropriate guardband) and the voltage level specified by a manufacturer, then voltage transitions between high activity levels and low activity levels can utilize intermediate voltage levels such that the voltage transition between low and high activity is not too large. Voltage swings of over 100 mV may be considered excessive and either have to be compensated for by stepping the voltage in increments or simply using a fixed amount of additional voltage for low activity states, such as a minimum voltage plus 25 mV or a minimum voltage plus 50 mV.

Thus, the techniques discussed for increasing the operational frequency and associated device performance allow the system to operate at initial or default voltage levels during periods of time where extra performance is not desired or needed. Once a higher level of activity is desired, a frequency can be increased and a corresponding voltage can be lowered to keep power consumption (such as a power consumption level in Watts) below a preferred level. Once a lower desired power level and/or low activity level is detected, then the corresponding voltage and frequency levels can be allowed to recover to a previous value.

Figure 7:
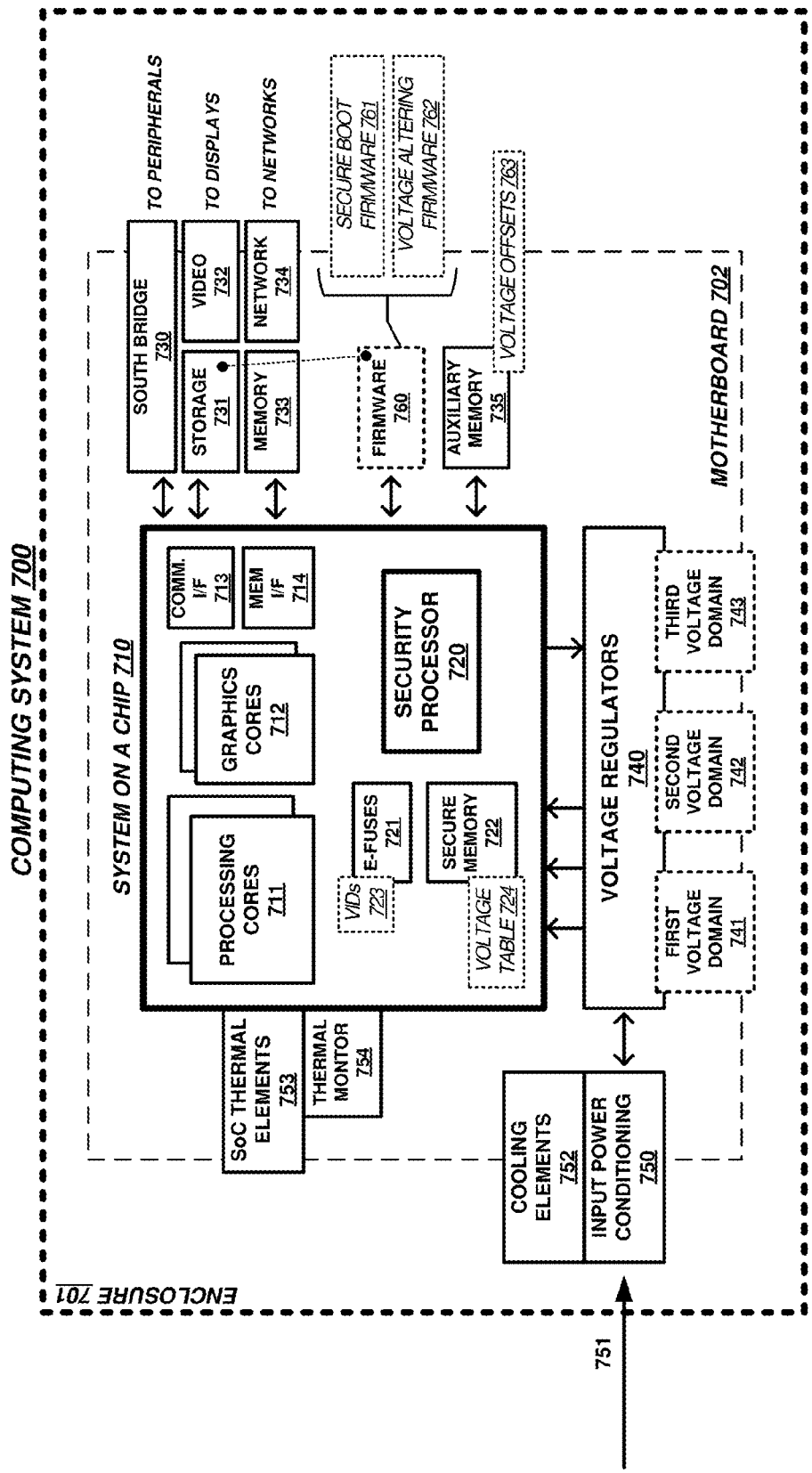
FIG. 7 illustrates an example computing system suitable for implementing any of the architectures, platforms, processes, methods, and operational scenarios disclosed herein.

FIG. 7 illustrates computing system 700 that is representative of any system or collection of systems in which the various operational architectures, platforms, scenarios, and processes disclosed herein may be implemented. For example, computing system 700 can be used to implement any of user system 110 in FIG. 1 or gaming system 410 in FIG. 4.

Examples of user system 110 or gaming system 410 when implemented by computing system 700 include, but are not limited to, a gaming console, smartphone, tablet computer, laptop, server, personal communication device, personal assistance device, wireless communication device, subscriber equipment, customer equipment, access terminal, telephone, mobile wireless telephone, personal digital assistant, personal computer, e-book, mobile Internet appliance, wireless network interface card, media player, or some other computing apparatus, including combinations thereof.

Computing system 700 may be implemented as a single apparatus, system, or device or may be implemented in a distributed manner as multiple apparatuses, systems, or devices. Computing system 700 includes, but is not limited to, enclosure 701, system on a chip (SoC) device 710, south bridge 730, storage system 731, video elements 732, memory elements 733, network module 734, auxiliary memory 735, voltage regulators 740, input power conditioning circuitry 750, cooling elements 752, SoC thermal elements 753, and thermal monitor 754. SoC device 710 is operatively coupled with the other elements in computing system 700, such as south bridge 730, storage system 731, video elements 732, memory elements 733, network module 734, auxiliary memory 735, voltage regulators 740, SoC thermal elements 753, and thermal monitor 754. One or more of the elements of computing system 700 can be included on motherboard 702, although other arrangements are possible.

SoC device 710 loads and executes software from storage system 731. Software can include various operating systems, user applications, gaming applications, multimedia applications, or other user applications. Software can also include firmware 760 which includes further elements indicated by secure boot firmware 761 and voltage altering firmware 762. Other software and firmware elements can be included in the software stored by storage system 731 and executed by SoC device 710, such as found in FIGS. 1 and 4.

When executed by SoC device 710 to provide voltage adjustment services, thermal voltage adjustment, in-situ characterization, or secure voltage scaling features, the software directs SoC device 710 to operate as described herein for at least the various processes, operational scenarios, and sequences discussed in the foregoing implementations. SoC device 710 may optionally include additional devices, features, or functionality not discussed for purposes of brevity.

Referring still to FIG. 7, SoC device 710 may comprise a micro-processor and processing circuitry that retrieves and executes software from storage system 731. SoC device 710 may be implemented within a single processing device, but may also be distributed across multiple processing devices or sub-systems that cooperate in executing program instructions. Examples of SoC device 710 include general purpose central processing units, application specific processors, graphics processing units, and logic devices, as well as any other type of processing device, combinations, or variations thereof.

In FIG. 7, SoC device 710 includes processing cores 711, graphics cores 712, communication interfaces 713, memory interfaces 714, security processor 720, electronic fuses 721, secure memory 722, among other elements. Some of the elements of SoC device 710 can be included in a north bridge portion of SoC device 710.

Storage system 731 may comprise any computer readable storage media readable by SoC device 710 and capable of storing software, such as firmware 760. Storage system 731 may include volatile and nonvolatile, removable and non-removable media implemented in any method or technology for storage of information, such as computer readable instructions, data structures, program modules, or other data. Examples of storage media include random access memory, read only memory, magnetic disks, optical disks, flash memory, virtual memory and non-virtual memory, magnetic cassettes, magnetic tape, magnetic disk storage or other magnetic storage devices, or any other suitable storage media. In no case is the computer readable storage media a propagated signal. In addition to computer readable storage media, in some implementations storage system 731 may also include computer readable communication media over which at least some of software may be communicated internally or externally. Storage system 731 may be implemented as a single storage device, but may also be implemented across multiple storage devices or sub-systems co-located or distributed relative to each other. Storage system 731 may comprise additional elements, such as a controller, capable of communicating with SoC device 710 or possibly other systems.

In particular, the program instructions may include various components or modules that cooperate or otherwise interact to carry out the various processes and operational scenarios described herein. The various components or modules may be embodied in compiled or interpreted instructions, or in some other variation or combination of instructions. The various components or modules may be executed in a synchronous or asynchronous manner, serially or in parallel, in a single threaded environment or multi-threaded, or in accordance with any other suitable execution paradigm, variation, or combination thereof. Software may include additional processes, programs, or components, such as operating system software or other application software, in addition to or that include firmware 760.

In general, software may, when loaded into SoC device 710 and executed, transform a suitable apparatus, system, or device (of which computing system 700 is representative) overall from a general-purpose computing system into a special-purpose computing system customized to provide voltage adjustment services, thermal voltage adjustment, in-situ characterization, or secure voltage scaling features, among other assistance services. Indeed, encoding software on storage system 731 may transform the physical structure of storage system 731. The specific transformation of the physical structure may depend on various factors in different implementations of this description. Examples of such factors may include, but are not limited to, the technology used to implement the storage media of storage system 731 and whether the computer-storage media are characterized as primary or secondary storage, as well as other factors. For example, if the computer readable storage media are implemented as semiconductor-based memory, software may transform the physical state of the semiconductor memory when the program instructions are encoded therein, such as by transforming the state of transistors, capacitors, or other discrete circuit elements constituting the semiconductor memory. A similar transformation may occur with respect to magnetic or optical media. Other transformations of physical media are possible without departing from the scope of the present description, with the foregoing examples provided only to facilitate the present discussion.

Turning now to the other elements of computing system 700, voltage regulators 740 provide operating voltages at associated currents to SoC device 710. Voltage regulators 740 comprise various power electronics, power controllers, filters, passive components, and other elements to convert input power received through input power conditioning elements 750 over link 751 from a power source into voltages usable by SoC device 710. SoC device 710 can instruct voltage regulators 740 to provide particular voltage levels for one or more voltage domains, such as first, second, and third voltage domains 741-743 in FIG. 7. SoC device 710 can instruct voltage regulators 740 to provide particular voltage levels for one or more operational modes, such as normal, standby, idle, and other modes. Voltage regulators 740 can comprise switched-mode voltage circuitry or other regulation circuitry. Cooling elements 752 can include fans, heatsinks, heat pumps, refrigeration elements, solid state cooling devices, liquid cooling devices, or other cooling elements which reduce or maintain a temperature within enclosure 701. SoC thermal elements 753 can include similar elements as cooling elements 752, although applied to SoC device 710 instead of the entire enclosure 701. Thermal monitor 754 can include one or more thermocouples or other temperature sensing elements which indicate to SoC device 710 a current temperature inside of enclosure 701, outside of enclosure 701, or temperatures associated with the various elements of system 700, including that of SoC device 710.

South bridge 730 includes interfacing and communication elements which can provide for coupling of SoC 710 to peripherals, user input devices, user interface devices, printers, microphones, speakers, or other external devices and elements. In some examples, south bridge 730 includes a system management bus (SMB) controller or other system management controller elements. Video elements 732 comprise various hardware and software elements for outputting digital images, video data, audio data, or other graphical and multimedia data which can be used to render images on a display, touchscreen, or other output devices. Digital conversion equipment, filtering circuitry, image or audio processing elements, or other equipment can be included in video elements 732.

Network elements 734 can provide communication between computing system 700 and other computing systems (not shown), which may occur over a communication network or networks and in accordance with various communication protocols, combinations of protocols, or variations thereof. Example networks include intranets, internets, the Internet, local area networks, wide area networks, wireless networks, wired networks, virtual networks, software defined networks, data center buses, computing backplanes, or any other type of network, combination of network, or variation thereof. The aforementioned communication networks and protocols are well known and need not be discussed at length here. However, some communication protocols that may be used include, but are not limited to, the Internet protocol (IP, IPv4, IPv6, etc.), the transmission control protocol (TCP), and the user datagram protocol (UDP), as well as any other suitable communication protocol, variation, or combination thereof.

Memory elements 733 can comprise random-access memory (RAM), cache memory devices, or other volatile memory elements employed by SoC 710. Storage system 731 comprises non-volatile memory elements, such as hard disk drives (HDDs), flash memory devices, solid state drives (SSDs), optical storage devices, phase-change memory devices, resistive memory devices, or other memory devices which store operating systems, applications, voltage adjustment firmware, or other software or firmware for system 700. Auxiliary memory 735 can comprise non-volatile memory elements, such as hard disk drives (HDDs), flash memory devices, solid state drives (SSDs), optical storage devices, phase-change memory devices, resistive memory devices, or other memory devices. In some examples, auxiliary memory 735 is included in storage system 731. In further examples, auxiliary memory 735 comprises a secure storage capable memory device, which can accept digitally signed data, such as voltage tables, voltage offset data, or other information.

Figure 8:
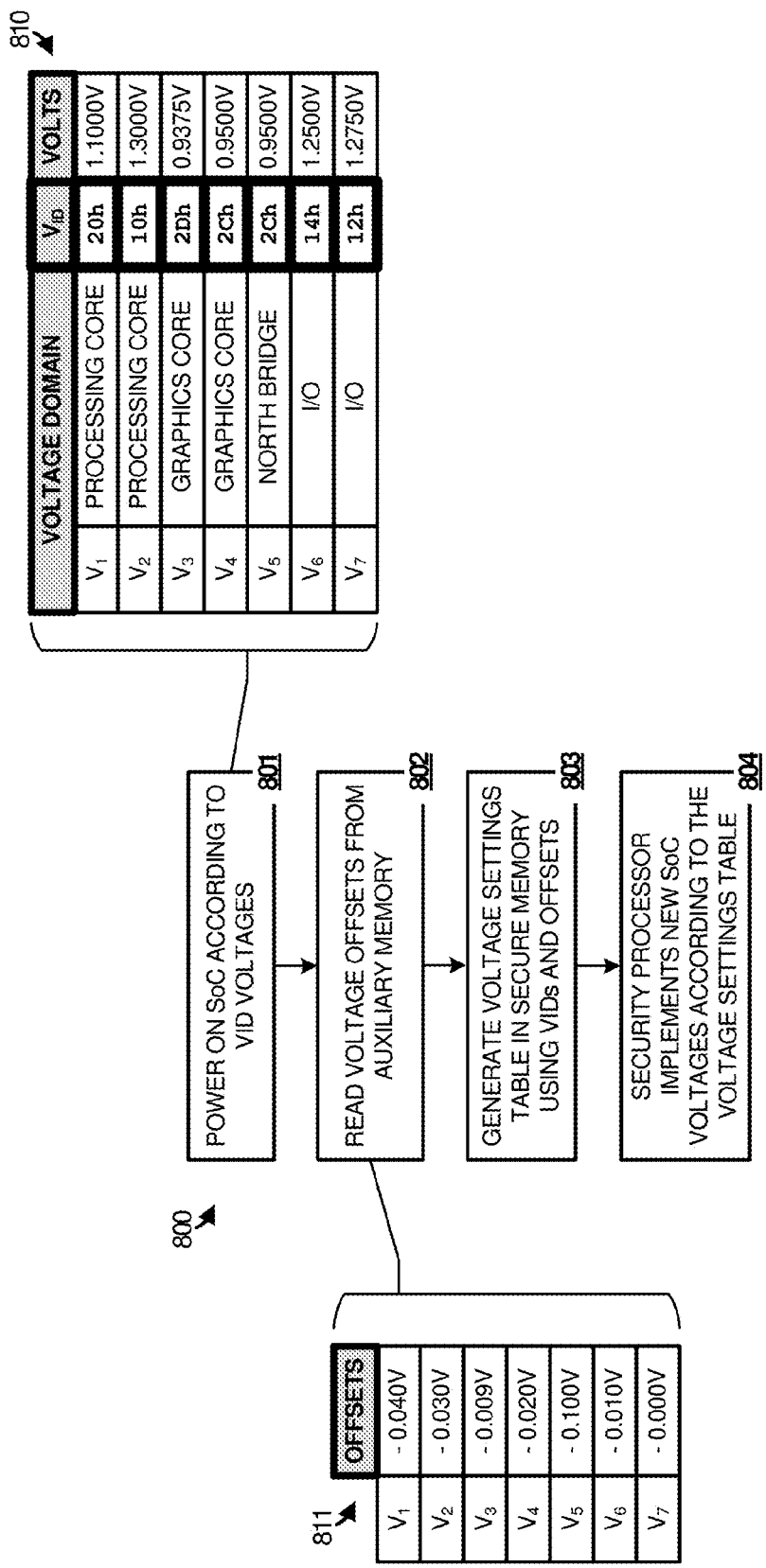
FIG. 8 illustrates a method of operating a secure voltage process in an implementation.

To illustrate operation of some of the elements of FIG. 7, a flow diagram in FIG. 8 is presented. Specifically, diagram 800 includes operations which describe secure voltage scaling, such as to boot computing system 700 with any of the voltages determined via a voltage adjustment process. In many computer systems, input voltages have security restrictions to prevent unauthorized operators from altering system voltages. Moreover, security measures, such as digitally signed voltage data can ensure that alterations to stored voltage data cannot occur without detection. It should be noted that the voltages/levels indicated in FIG. 8 are merely exemplary, and different voltages/levels will typically be employed in actual implementations.

Although the operations of FIG. 8 can be executed in general by computing system 700, specific operations are directed in FIG. 8 to security processor 720. Security processor 720 comprises a processing core separate from processing cores 711 and graphics cores 712. Security processor 720 might be included in separate logic than SoC 710 in some examples. Security processor 720 typically handles initialization procedures for SoC 710 during a power-on process or boot process. Thus, security processor 720 might be initialized and ready for operations prior to other elements of SoC 710.

Turning now to the operations of FIG. 8, SoC 710 powers on according to VID-indicated voltages (801). These VID-indicated voltages are represented by VIDs 723 in FIG. 7, and can be considered 'default' voltages that are typically specified according to a manufacturer specification or hard-coded by a manufacturer using electronic fuses (e-fuses) 721. In some examples, once these VIDs are set by a manufacturer, they cannot be altered by an operator or user of the SoC. The VIDs typically comprise a normalized value or encoded bits which are used to derive an actual voltage for driving SoC 710. Example VIDs can be seen in table 810 of FIG. 8. Specifically, table 810 includes a listing of voltage domains with corresponding VIDs in hexadecimal notation, along with a corresponding voltage. In typical examples, only the VIDs are provided to voltage regulators 740, and voltage regulators 740 translate the VIDs into actual voltages. Table 810 is shown with additional detail for clarity.

Once at least security processor 720 is powered on after receiving input power from voltage regulators 740 according to VIDs 723, then security processor 720 reads (802) voltage offsets 763 from auxiliary memory 735. These voltage offsets are determined in a voltage adjustment process, such as those described above, and stored in auxiliary memory 735 for later usage. Example voltage offsets are shown in table 811 in FIG. 8, and indicate an incremental offset for a plurality of voltage or power domains, which can include positive or negative offsets. The voltage offsets might be stored in auxiliary memory 735 using a secure storage process, such as a digitally signed security process. The security process authenticates the voltage offsets and ensures that tampering or alteration was not performed. The security process can include public-private key encryption techniques or other digital signature/authentication or data encryption techniques.

The voltage values determined from the voltage adjustment process can be stored into a memory device or data structure along with other corresponding information, such as time/date of the functional tests, version information for the functional tests, or other information. The version identifier can be used to provide special handling of results determined by different revisions of system 700. This data structure can be securely signed by a hardware security module (HSM) to ensure that the stored voltage information and related information is authentic. A digital signature for the data structure can be validated during each subsequent boot of system 700, and used as the selected operational voltage for the remainder of any factory/manufacturing tests and subsequent user site operation.

Security processor 720 generates (803) a voltage settings table 724 in secure memory 722 using VIDs 723 and voltage offsets 763. In some examples, security processor 720 adds voltages that correspond to the VIDs to the voltage offsets and generates new VIDs which are stored in secure memory 722. These new VIDs can be presented to voltage regulators 740 which responsively implement (804) input voltages for SoC 710 that correspond to the VIDs. Various margins or adjustments to the new VIDs or other voltage information in voltage table 724 can be made during operation of SoC 710, such as to add additional margins, implement EoL margins, provide thermal/power-based voltage adjustment or frequency-based throttling, or other features. In typical examples, only security processor 720 can access secure memory 722, and processing cores 711 or graphics cores 712 cannot access secure memory 722. Thus, a user-level application run in an operating system cannot typically directly modify VIDs. However, in this example, security processor 720 can receive requests from various drivers, hypervisors, or other elements to change VIDs responsive to user commands or other alteration inputs.

Certain inventive aspects may be appreciated from the foregoing disclosure, of which the following are various examples.

Example 1

A method of operating a voltage control system for a processing device, the method comprising operating the processing device in a computing assembly at a selected performance level, the processing device supplied with at least one input voltage at a first voltage level, monitoring thermal information associated with the computing assembly, and when the thermal information indicates a temperature associated with the computing assembly exceeds a threshold temperature, adjusting the at least one input voltage level supplied to the processing device to a second voltage level lower than the first voltage level and continuing to operate the processing device at the selected performance level.

Example 2

The method of Example 1, where the first voltage level comprises a manufacturer specified operating voltage for the processing device, and where the second voltage level comprises a voltage below the manufacturer specified operating voltage.

Example 3

The method of Examples 1-2, where the voltage below the manufacturer specified operating voltage is determined using a voltage adjustment process that identifies at least one minimum operating voltage for the processing device while operating at the selected performance level in the computing assembly.

Example 4

The method of Examples 1-3, where the voltage adjustment process comprises applying incrementally adjusted input voltages to the processing device, operating the processing device according to a functional test that exercises the processing device in context with associated system elements of the computing assembly, and monitoring for operational failures of at least the processing device during application of each of the incrementally adjusted input voltages to determine the at least one minimum operating voltage.

Example 5

The method of Examples 1-4, where the computing assembly includes one or more of an enclosure, thermal management elements, memory elements, data storage elements, and power electronics elements that accompany the processing device.

Example 6

The method of Examples 1-5, where the selected performance level comprises a selected operating frequency for logical portions of the processing device associated with the at least one input voltage level.

Example 7

The method of Examples 1-6, further comprising, when the thermal information indicates the temperature associated with the computing assembly exceeds a second threshold temperature, adjusting thermal management elements of the computing assembly to reduce the temperature and continuing to operate the processing device at the selected performance level.

Example 8

The method of Examples 1-7, further comprising, when the thermal information indicates the temperature associated with the computing assembly exceeds the threshold temperature and the at least one input voltage level has been reduced to a predetermined minimum operating voltage for the processor device, reducing performance of the processing device to a lower performance level than the selected performance level.

Example 9

An apparatus comprising one or more computer readable storage media, and program instructions stored on the one or more computer readable storage media. When executed by a computing system, the program instructions direct the computing system to at least operate a processor device of the computing system at a selected performance level, the processor device supplied with at least one input voltage at a first voltage level, monitor thermal information associated with the computing system, and when the thermal information indicates a temperature associated with the computing system exceeds a threshold temperature, adjust the at least one input voltage level supplied to the processor device to a second voltage level lower than the first voltage level while continuing to operate the processor device at the selected performance level.

Example 10

The apparatus of Example 9, where the first voltage level comprises a manufacturer specified operating voltage for the processor device, and where the second voltage level comprises a voltage below the manufacturer specified operating voltage.

Example 11

The apparatus of Examples 9-10, where the voltage below the manufacturer specified operating voltage is determined using a voltage adjustment process that identifies at least one minimum operating voltage for the processor device while operating at the selected performance level in the computing system.

Example 12

The apparatus of Examples 9-11, where the voltage adjustment process comprises applying incrementally adjusted input voltages to the processor device, operating the processor device according to a functional test that exercises the processor device in context with associated system elements of the computing system, and monitoring for operational failures of at least the processor device during application of each of the incrementally adjusted input voltages to determine the at least one minimum operating voltage.

Example 13

The apparatus of Examples 9-12, where the computing system includes one or more of an enclosure, thermal management elements, memory elements, data storage elements, and power electronics elements that accompany the processor device.

Example 14

The apparatus of Examples 9-13, where the selected performance level comprises a selected operating frequency for logical portions of the processor device associated with the at least one input voltage level.

Example 15

The apparatus of Examples 9-14, comprising further program instructions, when executed by the computing system, direct the computing system to at least, when the thermal information indicates the temperature associated with the computing system exceeds a second threshold temperature, adjust thermal management elements of the computing system to reduce the temperature while continuing to operate the processor device at the selected performance level.

Example 16

The apparatus of Examples 9-15, comprising further program instructions, when executed by the computing system, direct the computing system to at least reduce performance of the processor device to a lower performance level than the selected performance level when the thermal information indicates the temperature associated with the computing system exceeds the threshold temperature and the at least one input voltage level has been reduced to a predetermined minimum operating voltage for the processor device.

Example 17

A thermal control system for a computing assembly, comprising a voltage control module configured to instruct a voltage regulation system of the computing assembly to provide at least one input voltage at a first voltage level to a processor device of the computing assembly while the processor device operates at a first performance level. The thermal control system comprising a thermal monitoring module configured to monitor at least temperature information associated with the computing assembly. When the temperature information indicates a temperature associated with the computing assembly exceeds a threshold temperature, the voltage control module is configured to adjust the at least one input voltage level supplied to the processor device to a second voltage level lower than the first voltage level while the processor device continues to operate at the first performance level, where the second voltage level comprises a voltage below a manufacturer specified operating voltage.

Example 18

The system of Example 17, where the first performance level comprises a selected operating frequency for logical portions of the processor device associated with the at least one input voltage level.

Example 19

The system of Examples 17-18, comprising, when the temperature information indicates the temperature associated with the computing assembly exceeds a second threshold temperature, the voltage control module is configured to adjust thermal management elements of the computing assembly to increase an airflow in an enclosure of the computing assembly while the processor device continues to operate at the first performance level.

Example 20

The system of Examples 17-19, comprising the voltage control module configured to identify when the temperature information indicates the temperature associated with the computing assembly exceeds the threshold temperature and the at least one input voltage level has been reduced to a predetermined minimum operating voltage for the processor device below the manufacturer specified operating voltage, and responsively instruct the processor device to reduce performance of the processor device to a lower performance level than the first performance level.

The functional block diagrams, operational scenarios and sequences, and flow diagrams provided in the Figures are representative of exemplary systems, environments, and methodologies for performing novel aspects of the disclosure. While, for purposes of simplicity of explanation, methods included herein may be in the form of a functional diagram, operational scenario or sequence, or flow diagram, and may be described as a series of acts, it is to be understood and appreciated that the methods are not limited by the order of acts, as some acts may, in accordance therewith, occur in a different order and/or concurrently with other acts from that shown and described herein. For example, those skilled in the art will understand and appreciate that a method could alternatively be represented as a series of interrelated states or events, such as in a state diagram. Moreover, not all acts illustrated in a methodology may be required for a novel implementation.

The descriptions and figures included herein depict specific implementations to teach those skilled in the art how to make and use the best option. For the purpose of teaching inventive principles, some conventional aspects have been simplified or omitted. Those skilled in the art will appreciate variations from these implementations that fall within the scope of the invention. Those skilled in the art will also appreciate that the features described above can be combined in various ways to form multiple implementations. As a result, the invention is not limited to the specific implementations described above, but only by the claims and their equivalents.

What is claimed is:

1. A method of operating a voltage control system for a processing device, the method comprising:
performing a voltage adjustment process comprising applying incrementally adjusted input voltages to the processing device, operating the processing device according to a functional test comprising an application or script executed in at least an operating system booted on the processing device that exercises power consumption above a threshold level for the processing device for at least a selected voltage domain along with elements of the computing assembly external to the processing device that share at least the selected voltage domain, and monitoring for operational failures of at least the processing device during application of each of the incrementally adjusted input voltages to determine at least one minimum operating voltage lower than a minimum voltage level specified by a manufacturer of the processing device;
operating the processing device in a computing assembly at a selected performance level, the processing device supplied with at least one input voltage at a first voltage level;
monitoring thermal information associated with the computing assembly;
when the thermal information indicates a temperature associated with the computing assembly exceeds a threshold temperature, adjusting the at least one input voltage level supplied to the processing device to the at least one minimum operating voltage and continuing to operate the processing device at the selected performance level.

2. The method of claim 1, wherein the first voltage level comprises a manufacturer specified operating voltage for the processing device.

3. The method of claim 2, wherein the voltage below the manufacturer specified operating voltage is determined using the voltage adjustment process that identifies the at least one minimum operating voltage for the processing device while operating at the selected performance level in the computing assembly.

4. The method of claim 1, wherein the computing assembly includes one or more of an enclosure, thermal management elements, memory elements, data storage elements, and power electronics elements that accompany the processing device.

5. The method of claim 1, wherein the selected performance level comprises a selected operating frequency for logical portions of the processing device associated with the at least one input voltage level.

6. The method of claim 1, further comprising:
when the thermal information indicates the temperature associated with the computing assembly exceeds a second threshold temperature, adjusting thermal management elements of the computing assembly to reduce the temperature and continuing to operate the processing device at the selected performance level.

7. The method of claim 1, further comprising:
when the thermal information indicates the temperature associated with the computing assembly exceeds the threshold temperature and the at least one input voltage level has been reduced to a predetermined minimum operating voltage for the processor device, reducing performance of the processing device to a lower performance level than the selected performance level.

8. An apparatus comprising:
one or more non-transitory computer readable storage media;
program instructions stored on the one or more non-transitory computer readable storage media that, when executed by a computing system, direct the computing system to at least:
perform a voltage adjustment process comprising applying incrementally adjusted input voltages to a processing device, operating the processing device according to a functional test comprising an application or script executed in at least an operating system booted on the processing device that exercises power consumption above a threshold level for the processing device for at least a selected voltage domain along with elements of the computing assembly external to the processing device that share at least the selected voltage domain, and monitoring for operational failures of at least the processing device during application of each of the incrementally adjusted input voltages to determine at least one minimum operating voltage lower than a minimum voltage level specified by a manufacturer of the processing device;
operate the processor device of the computing system at a selected performance level, the processor device supplied with at least one input voltage at a first voltage level;

monitor thermal information associated with the computing system;

when the thermal information indicates a temperature associated with the computing system exceeds a threshold temperature, adjust the at least one input voltage level supplied to the processor device to the at least one minimum operating voltage while continuing to operate the processor device at the selected performance level.

9. The apparatus of claim 8, wherein the first voltage level comprises a manufacturer specified operating voltage for the processor device.

10. The apparatus of claim 9, wherein the voltage below the manufacturer specified operating voltage is determined using the voltage adjustment process that identifies the at least one minimum operating voltage for the processor device while operating at the selected performance level in the computing system.

11. The apparatus of claim 8, wherein the computing system includes one or more of an enclosure, thermal management elements, memory elements, data storage elements, and power electronics elements that accompany the processor device.

12. The apparatus of claim 8, wherein the selected performance level comprises a selected operating frequency for logical portions of the processor device associated with the at least one input voltage level.

13. The apparatus of claim 8, comprising further program instructions, when executed by the computing system, direct the computing system to at least:

when the thermal information indicates the temperature associated with the computing system exceeds a second threshold temperature, adjust thermal management elements of the computing system to reduce the temperature while continuing to operate the processor device at the selected performance level.

14. The apparatus of claim 8, comprising further program instructions, when executed by the computing system, direct the computing system to at least:

reduce performance of the processor device to a lower performance level than the selected performance level when the thermal information indicates the temperature associated with the computing system exceeds the threshold temperature and the at least one input voltage level has been reduced to a predetermined minimum operating voltage for the processor device.

15. A thermal control system for a computing assembly, comprising:

a voltage control module configured to perform a voltage adjustment process comprising applying incrementally adjusted input voltages to a processing device, operating the processing device according to a functional test comprising an application or script executed in at least an operating system booted on the processing device that exercises power consumption above a threshold level for the processing device for at least a selected voltage domain along with elements of the computing assembly external to the processing device that share at least the selected voltage domain, and monitoring for operational failures of at least the processing device during application of each of the incrementally adjusted input voltages to determine at least one minimum operating voltage lower than a minimum voltage level specified by a manufacturer of the processing device;

the voltage control module configured to instruct a voltage regulation system of the computing assembly to provide at least one input voltage at a first voltage level to a processor device of the computing assembly while the processor device operates at a first performance level;

a thermal monitoring module configured to monitor at least temperature information associated with the computing assembly;

based at least on the temperature information indicating a temperature associated with the computing assembly exceeds a threshold temperature, the voltage control module configured to adjust the at least one input voltage level supplied to the processor device to the at least one minimum operating voltage while the processor device continues to operate at the first performance level.

16. The system of claim 15, wherein the first performance level comprises a selected operating frequency for logical portions of the processor device associated with the at least one input voltage level.

17. The system of claim 15, comprising:

when the temperature information indicates the temperature associated with the computing assembly exceeds a second threshold temperature, the voltage control module is configured to adjust thermal management elements of the computing assembly to increase an airflow in an enclosure of the computing assembly while the processor device continues to operate at the first performance level.

18. The system of claim 15, comprising:

the voltage control module configured to identify when the temperature information indicates the temperature associated with the computing assembly exceeds the threshold temperature and the at least one input voltage level has been reduced to a predetermined minimum operating voltage for the processor device below the manufacturer specified operating voltage, and responsively instruct the processor device to reduce performance of the processor device to a lower performance level than the first performance level.

* * * * *